(12) United States Patent
You et al.

(10) Patent No.: US 6,317,642 B1
(45) Date of Patent: *Nov. 13, 2001

(54) APPARATUS AND METHODS FOR UNIFORM SCAN DISPENSING OF SPIN-ON MATERIALS

(75) Inventors: Lu You, Santa Clara; Dawn Hopper, San Jose; Christof Streck, Sunnyvale, all of CA (US); John Pellerin, Austin, TX (US); Richard J. Huang, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/191,438

(22) Filed: Nov. 12, 1998

(51) Int. Cl.[7] .................................................. G06F 19/00
(52) U.S. Cl. ........................... 700/121; 427/240; 438/782
(58) Field of Search .................... 700/121; 118/684–688; 427/9, 240; 438/149, 780–782

(56) References Cited

U.S. PATENT DOCUMENTS

| | | | |
|---|---|---|---|
| 3,980,042 | 9/1976 | Stut | 118/5 |
| 4,817,558 | 4/1989 | Itoh | 118/725 |

(List continued on next page.)

OTHER PUBLICATIONS

Wang, "Spin–On Dielectric Films—A General Overview," Solid State and Integrated Circuit Technology, 1998, Proceedings, 1998 5th International Conference, IEEE/EE Electronic Library Online, Abstract, p. 961.

Wolf, Ph.D., et al., "Silicon Processing for the VLSI Era, vol. 1: Process Technology," Lattice Press, pp. 265–266, 430–434.

Jacobson, D., et al., "Recommendation for Priming a Filter in a Wafergard Gen–2 Pump," Microelectronics Division, Millipore Corporation, Oct. 12, 1994, pp. 1, 3, and 5.

(List continued on next page.)

Primary Examiner—William Grant
Assistant Examiner—Ronald D Hartman, Jr.
(74) Attorney, Agent, or Firm—Fliesler, Dubb, Meyer & Lovejoy

(57) ABSTRACT

This invention describes improved apparatus and methods for spin-on deposition of semiconductor thin films. The improved apparatus provides for controlled temperature, pressure and gas compositions within the deposition chamber. The improved methods comprise dispensing of solutions containing thin film precursor via a moveable dispensing device and the careful regulation of the pattern of deposition of the precursor solution onto the wafer. The invention also comprises the careful regulation of deposition variables including dispensation time, wafer rpm, stop time and rates of wafer rotation. In one embodiment, the precursor solution is dispensed from the outer edge of the wafer toward the center. In alternative embodiments, processors regulate the movement of the dispensing arm and the precursor pump to provide an evenly dispensed layer of precursor solution. The invention also describes improved methods for evaporating solvents and curing thin films. The methods of this invention enable the production of spin-on thin films, which have more even film thickness and uniformity. The semiconductor thin films produced by the methods of this invention are useful for the manufacture of semiconductor devices comprising interlevel dielectric materials.

22 Claims, 14 Drawing Sheets

U.S. PATENT DOCUMENTS

| | | | | |
|---|---|---|---|---|
| 4,849,296 | * | 7/1989 | Haluska | 428/457 |
| 4,996,080 | | 2/1991 | Daraktchiev | 427/57 |
| 5,134,962 | * | 8/1992 | Amada | 118/688 |
| 5,138,520 | | 8/1992 | McMillan et al. | 361/311 |
| 5,587,330 | | 12/1996 | Yamazaki | 437/41 |
| 5,602,060 | | 2/1997 | Kobayashi et al. | 437/238 |
| 5,630,881 | | 5/1997 | Ogure et al. | 118/730 |
| 5,646,071 | | 7/1997 | Lin et al. | 485/228 |
| 5,648,282 | | 7/1997 | Yoneda | 437/40 |
| 5,670,210 | | 9/1997 | Mandal et al. | 427/240 |
| 5,677,001 | * | 10/1997 | Wang et al. | 427/240 |
| 5,707,900 | | 1/1998 | Sano et al. | 438/509 |
| 5,773,083 | * | 6/1998 | Fischer et al. | 427/240 |
| 5,780,105 | * | 7/1998 | Wang | 427/240 |
| 5,840,821 | | 11/1998 | Nokano et al. | 528/10 |
| 5,874,128 | | 2/1999 | Kim | 427/240 |
| 5,883,001 | | 3/1999 | Jin et al. | 438/624 |
| 5,925,410 | | 7/1999 | Akram et al. | 427/240 |
| 5,939,130 | * | 8/1999 | Shiraishi et al. | 427/9 |
| 5,942,035 | | 8/1999 | Hasebe et al. | 118/52 |
| 5,962,085 | | 10/1999 | Hayashi et al. | 427/585 |
| 5,985,363 | | 11/1999 | Shiau et al. | 427/240 |
| 5,985,364 | | 11/1999 | Smith et al. | 427/240 |
| 5,989,632 | | 11/1999 | Sanada et al. | 427/240 |
| 5,989,945 | * | 11/1999 | Yudasaka | 438/149 |
| 6,004,622 | | 12/1999 | Yen et al. | 427/240 |
| 6,015,457 | | 1/2000 | Leung et al. | 106/287.16 |
| 6,017,806 | | 1/2000 | Harvey | 438/475 |
| 6,056,998 | * | 5/2000 | Fujimoto | 427/240 |
| 6,099,646 | * | 8/2000 | Yang et al. | 118/684 |
| 6,127,279 | * | 10/2000 | Konuma | 438/745 |
| 6,139,639 | * | 10/2000 | Kitamura et al. | 118/680 |
| 6,191,053 | * | 2/2001 | Chun et al. | 438/780 |
| 6,225,240 | * | 5/2001 | You et al. | 438/782 |

OTHER PUBLICATIONS

Bowers, William, et al., "Design, Performance Validation, and Reliability Testing of a New Photochemical Dispense Pump," Millipore Corporation and Silicon Valley Group, Inc.

"Wafergard® Gen–2 Photochemical Dispense System," Data Sheet, *Millipore*.

"Wafergard® Gen–2$^{Plus}$ Photochemical Dispense System," Data Sheet, *Millipore*.

Treichel, et al., "Low Dielectric Constant Materials for Interlayer Dielectric," Dumic Conference, Feb. 16–17, 1998, 1998 IMIC—333D/98/0201, pp. 1–10.

Giannelis, et al., "Spin–On Films Add New Dimension to ULSI Circuits," *IEEE Circuits and Devices Magazine*, Nov. 1993, vol. 9, Issue 6, pp. 30–34.

* cited by examiner

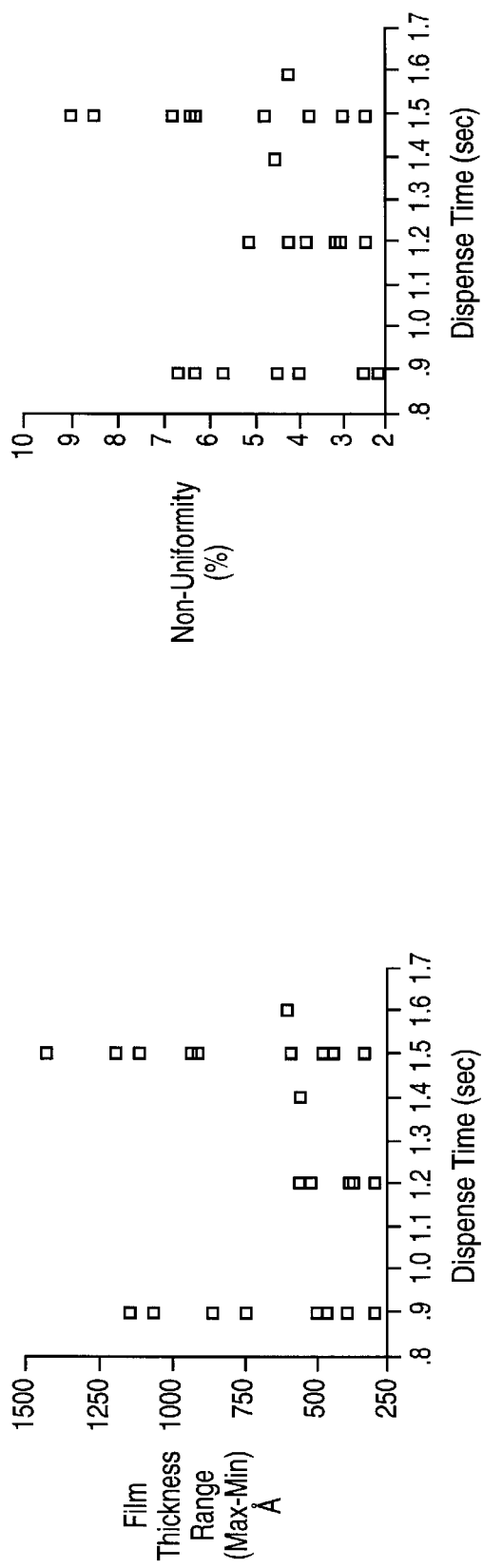
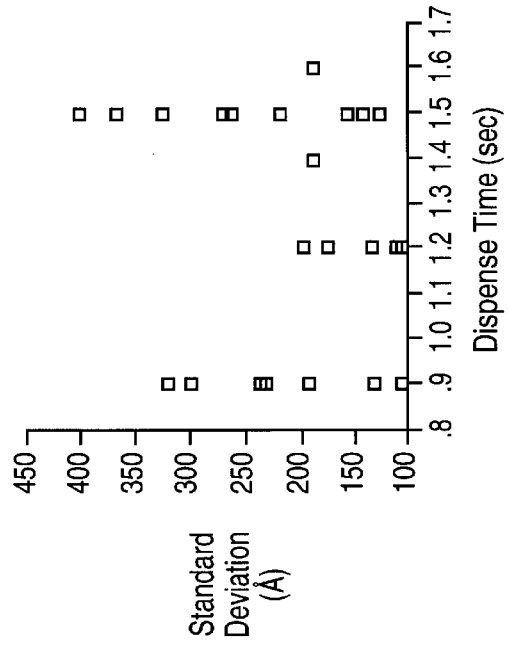
FIG. 4a
FIG. 4b
FIG. 4c

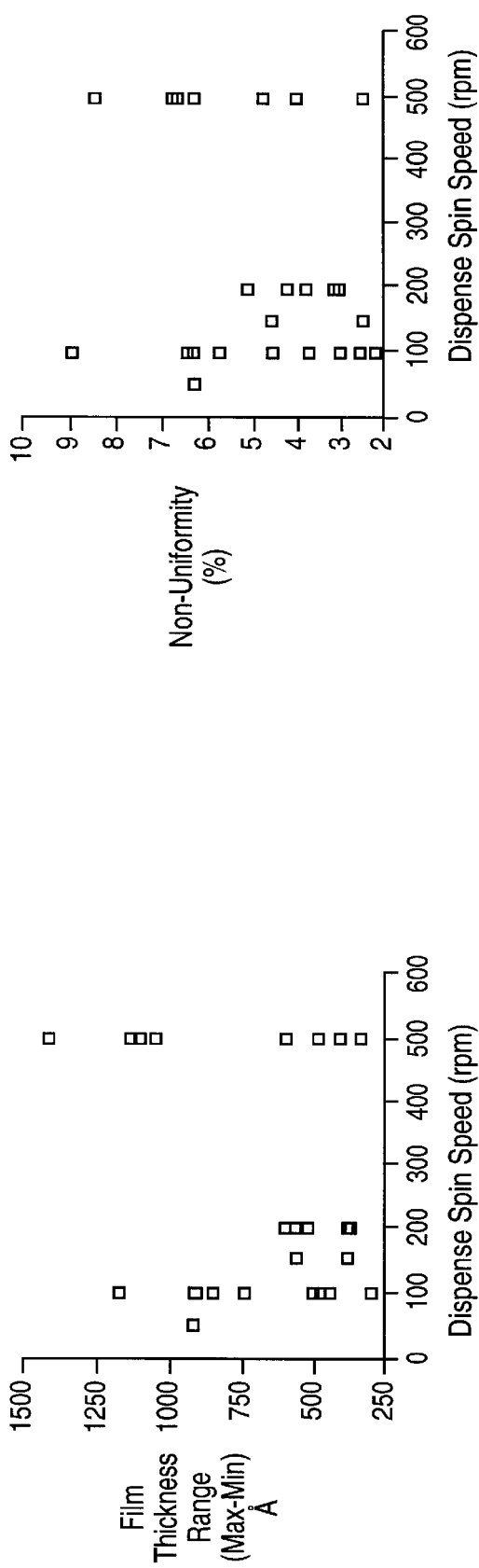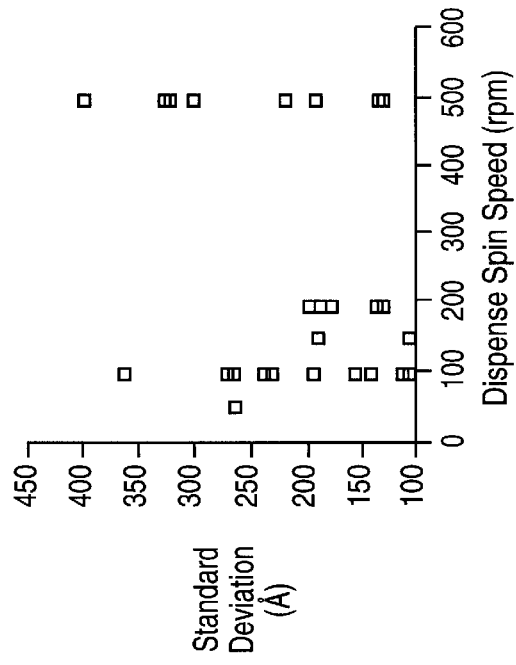

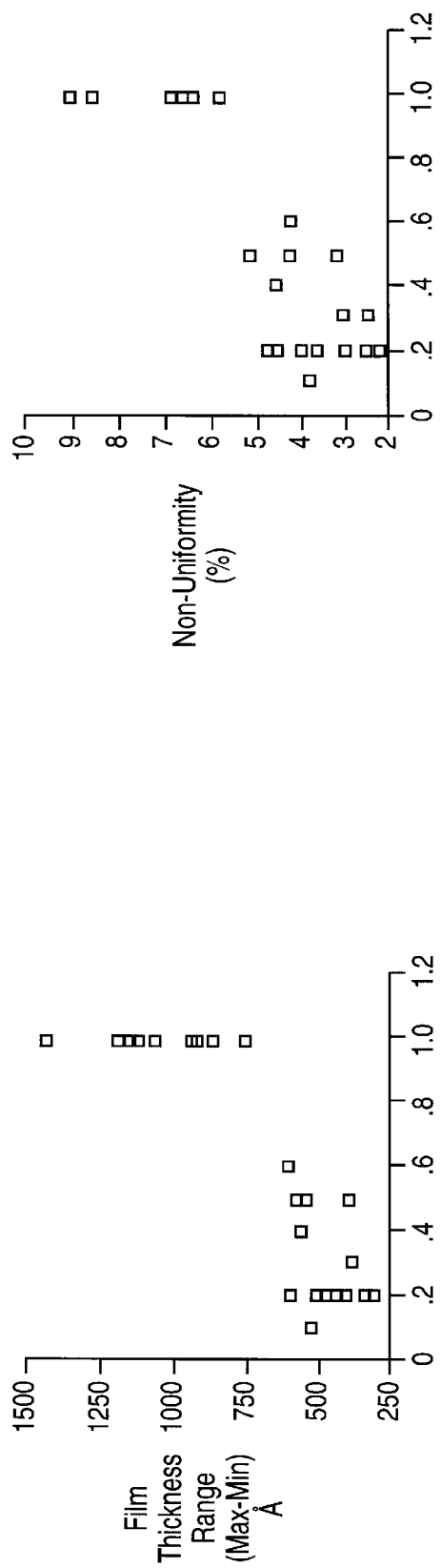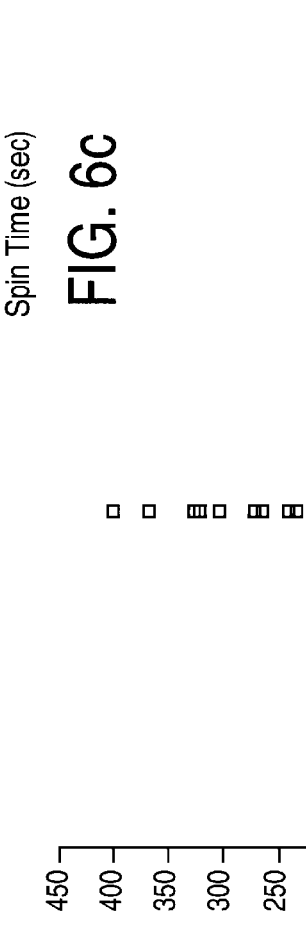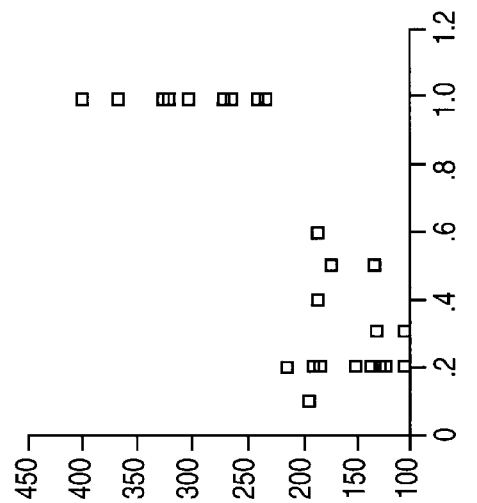
FIG. 6a
FIG. 6b
FIG. 6c

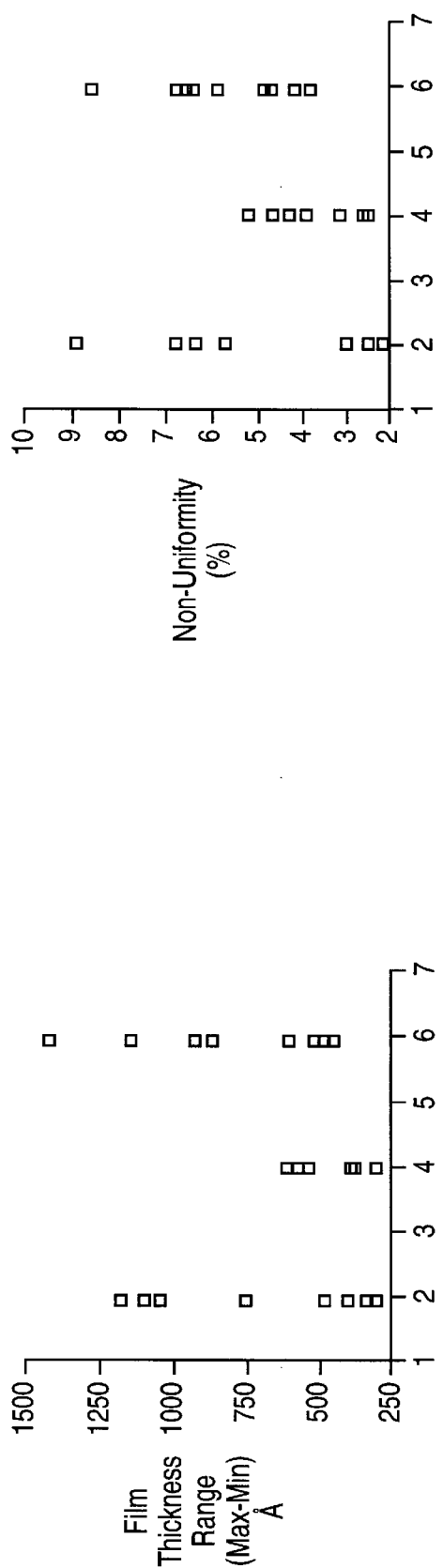
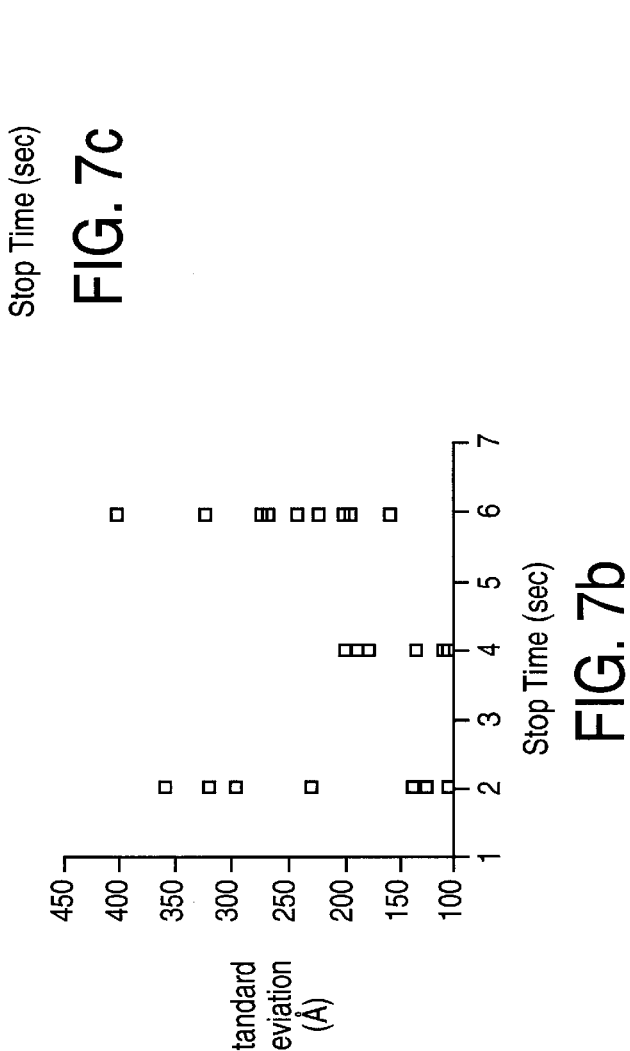
FIG. 7a
FIG. 7b
FIG. 7c

APPARATUS AND METHODS FOR UNIFORM SCAN DISPENSING OF SPIN-ON MATERIALS

CROSS-REFERENCE TO RELATED APPLICATIONS

U.S. patent application Ser. No.: 09/190,721, entitled: "Closed Deposition Apparatus and Methods for Regulating Drying of Spin-On Films." Inventors: Lu You, Dawn Hopper, Richard J. Huang. Filed: Nov. 12, 1998

U.S. patent application Ser. No.: 09/191,101, entitled: "Rapid Acceleration Methods for Global Planarization of Spin-On Films." Inventors: Lu You, Dawn Hopper, Richard J. Huang. Filed: Nov. 12, 1998, now U.S. Pat. No. 6,225,240.

U.S. patent application Ser. No.: 09/191,435, entitled: "Solution Flow-In for Uniform Deposition of Spin-On Films." Inventors; Lu You, Dawn Hopper, Richard J. Huang. Filed: Nov. 12, 1998.

U.S. patent application Ser. No.: 09/190,722, entitled: "Methods of Manufacture of Uniform Spin-On Films." Inventors: Lu You, Dawn Hopper, Richard J. Huang. Filed: Nov. 12, 1998.

U.S. patent application Ser. No.: 09/191,430, entitled: "Semiconductor Devices Having Spin-On Thin Films With Global and Local Planarity." Inventors: Lu You, Dawn Hopper, Richard J. Huang. Filed: Nov. 12, 1998.

U.S. patent application Ser. No.: 09/191,040, entitled: "Cure Process for Manufacture of Low Dielectric Constant Interlevel Dielectric Layers." Inventors: Lu You, Simon Chan, John Iacoponi, Richard J. Huang, Robin Cheung. Filed: Nov. 12, 1998, now U.S. Pat. No. 6,200,913.

Each of the above-identified patent applications is herein incorporated fully by reference.

BACKGROUND OF THE INVENTION

1. Field of the Invention

The present invention relates to the field of manufacturing thin films using spin-on methods. Specifically, this invention relates to (1) the manufacture of low dielectric constant layers for insulation of metal interconnects in semiconductor devices and (2) photoresist layers. More specifically, the invention relates to apparatus for and methods for improving the quality of spin-on thin films, including the use of a processor to regulate the deposition of spin-on films.

2. Discussion of the Related Art

Spin-on deposition methods are used for the manufacture of thin films on semiconductor devices. Generally, a solution comprising a solvent and a precursor of the material to be deposited is placed in the center of a semiconductor wafer and then the wafer is rotated at a rate sufficient to distribute the solution across the surface of the wafer (a "rapid spin step"). The amount of solution, the solution viscosity, the solvent evaporation rate, the acceleration and the maximum spinning speed determine, in general, the thickness of the spin-on coating.

The deposition of low dielectric constant materials such as glass and glass-like materials have also been deposited by spin-on methods. These spin-on-glass (SOG) methods generally involve the placement of a pool or puddle of a solution comprising a silicate or other precursor and an solvent such as an alcohol on the center of a semiconductor wafer. Typically, for a wafer with a diameter of 8 inches, about 4 ml of solution is used. The wafer is then rotated to distribute the solution over the wafer surface. During spinning, as the solvents evaporate, residual material, including by way of example only, an $SiO_2$-like layer, is deposited on the wafer. Typically, spin-on processes have been carried out at atmospheric pressure under ambient conditions, such as in air. For certain precursor solutions containing solvents with high volatility, solvent can evaporate so rapidly as to cause the spin-on layer to solidify before all of the thinning and evening steps have been completed. For these materials, the resulting spin-on layers are not ideally suited for manufacture of semiconductor devices. Layers deposited in this fashion can have non-uniformities of 20% or greater when deposited on patterned wafers with metal interconnects. For future integrated circuit manufacture, however, this non-uniformity presents a significant problem. This is true especially in the manufacture of multi-layered films. Each layer contributes its own nonuniformity to the multilayered film, and because the nonuniformity tends to be in the form of a thicker layer at the center of the wafer, the overall nonuniformity increases with the number of layers.

As a result of these problems, these processes are suitable for the manufacture of semiconductor devices with gap dimensions of greater than 0.5 $\mu$m. For purposes of this application, the term gap dimensions means the distance separating integrated circuit elements, for example, metal lines. Thus, filling the gaps between semiconductor elements requires that the deposition process provide dielectric material which can penetrate into the recesses of the gap. Conventional spin-on methods are not suited for manufacturing devices with gap dimensions of less than 0.5 $\mu$m. First, dispensing of a puddle of solution onto the middle of the wafer creates less complete coverage at the edges of the wafer. To counteract this problem, the puddle typically includes substantially more solution than is necessary to provide an even layer of solution over the wafer. During the rapid spinning step, more of the solution is spun off of the wafer, resulting in substantial loss of expensive precursors and environmentally harmful solvents. Next, as gaps in the metal interconnect pattern become narrower, it is more difficult to evenly fill the gaps, especially as the solution is distributed radially across the surface with a high velocity. Furthermore, as the solution is distributed radially, the solvent evaporates from the solution. This can lead to changes in the concentration of precursor in the solution and/or the viscosity of the solution as it is being distributed across the wafer.

These features of the prior art methods result in poor planarity of the surface, which can reduce the accuracy of subsequent manufacturing steps. The resulting semiconductor devices then can have low reliability. These problems have limited the minimum size of features which can be coated using spin-on methods.

Conventional solutions to these problems included the use of greater amounts of spin-on solution or the use of longer spin times. However, the use of more solution results in higher losses of chemicals, and longer spin times reduces the through-put in the wafer manufacturing process.

Certain types of dielectric materials can be cross-linked after deposition to increase the mechanical strength of the resulting thin film. However, prior art methods usually involve rapid temperature increases, which can result in thermomechanical stress being placed on the film. Mechanical stresses can weaken the film and can lead to increases in dielectric constant and decreased dielectric strength. These effects can result in decreased useful lifetimes of the thin films.

SUMMARY OF THE INVENTION

Therefore, one object of this invention is the manufacture of spin-on layers with improved planarity on metal interconnect patterned wafers.

Another object of the invention is the manufacture of spin-on layers with better gap filling properties.

A further object of the invention is the manufacture of spin-on layers with more even deposition.

Yet another object of the invention is the manufacture of thinner spin-on layers.

An additional object of the invention is the manufacture of spin-on layers which produce less chemical waste.

A yet additional object of the invention is the manufacture of spin-on layers which are more rapidly manufactured.

A further object of the invention is the manufacture of spin-on layers with low dielectric constant, high dielectric strength, and high mechanical strength.

In one embodiment, the instant invention provides methods for manufacturing more uniform spin-on layers by improving the dispensing of spin-on solutions to achieve even layers of solutions of precursors of semiconductor thin films.

In one aspect of the invention, the improved methods for dispensing precursor solutions over the wafer surface are carried out wherein the precursor solution is pumped through a nozzle positioned over the wafer which is rotated at the same time as the nozzle is moved between the edge of the wafer and the wafer center, thereby providing a continuous layer of precursor solution on the wafer prior to the rapid spin step.

A further aspect of the invention is the deposition of precursor solutions from the outside edge of the wafer toward the center, thereby providing a more even layer of precursor solution prior to the rapid spinning step.

Another aspect of the invention is the regulation of the precursor dispensation using a processor to independently control the flow rate of precursor solution, wafer rotation velocity and/or dispensing nozzle velocity as the wafer is rotated, to provide an even layer of precursor solution on the wafer.

An additional embodiment of the invention is the use of high rates of acceleration during the rapid spinning step, high maximum rotation speed, high rates of deceleration, and reduced spin durations to distribute and thin the precursor solution, thereby resulting in a more even, thinner spin-on layer.

A further embodiment of the invention is the use of a solution flow-in period, wherein after the rapid spin step the wafer rotation is slowed to permit the precursor solution to spread evenly on the semiconductor wafer, and to provide improved planarity of the surface of the resulting thin film.

Yet another embodiment of the invention is the use of a closed deposition system to regulate the rates of evaporation of solvents during the dispensing, rapid spin, solution flow-in, and evaporation steps.

Another aspect of this invention is the regulation of solvent vapor pressure to control the rates of evaporation of solvent.

A yet further aspect of the invention is the use of increased deposition chamber pressure to decrease the rate of solvent evaporation during dispensation, rapid spin, and flow-in steps.

A yet further aspect of the invention is the use of decreased deposition pressure to improve the filling of gaps and to decrease the time necessary for evaporation of solvents.

An additional aspect of the invention is the use of reduced solvent pressure to increase the rate of evaporation during evaporation and curing steps.

A further aspect of the invention is the use of a processor to coordinate and regulate dispensation, deposition chamber conditions, flow-in, rapid spin, evaporation, and/or curing steps.

BRIEF DESCRIPTION OF THE DRAWINGS

FIGS. 4a, 4b and 4c are plots showing the relationships between film thickness range, standard deviation and film non-uniformity, respectively, and the dispense time of the precursor solution for thin films deposited on metal patterned wafers.

FIGS. 5a, 5b and 5c are plots showing the relationships between film thickness range, standard deviation and film non-uniformity, respectively, and the dispense spin speed for thin films deposited on metal patterned wafers.

FIGS. 6a, 6b and 6c are plots showing the relationships between film thickness range, standard deviation and film non-uniformity, respectively, and the spin time after dispensation for thin films deposited on metal patterned wafers.

FIGS. 7a, 7b and 7c are plots showing the relationships between film thickness range, standard deviation and film non-uniformity, respectively, and the stop time after dispensation for thin films deposited on metal patterned wafers.

DETAILED DESCRIPTION OF THE INVENTION

This invention solves the problems in the prior art methods for spin-on-deposition by separately regulating the steps in the manufacturing process to provide an even, high quality thin film on a substrate surface. The improved steps in the manufacture of spin-on films include the use of: (1) a closed deposition chamber, whereby the conditions of spin-on deposition can be regulated; (2) the dispensing of precursor solutions in fashions to provide an even layer of precursor solution distributed over the entire wafer surface prior to the rapid spinning step; (3) the use of rapid acceleration, high maximum wafer rotation speed and high rates of deceleration to even and thin the precursor solution; (4) a period of solution flow-in after the rapid spinning step to permit the precursor solution to distribute over the wafer surface more evenly; and (5) control over the solvent evaporation and curing steps of the thin film. Any type of film which can normally be deposited in solution can be deposited advantageously using the apparatus and methods of this invention. Such layers include but are not limited to photoresist layers and low dielectric constant films.

I. Closed Deposition Chamber for Spin-On Deposition

Figure 1A:
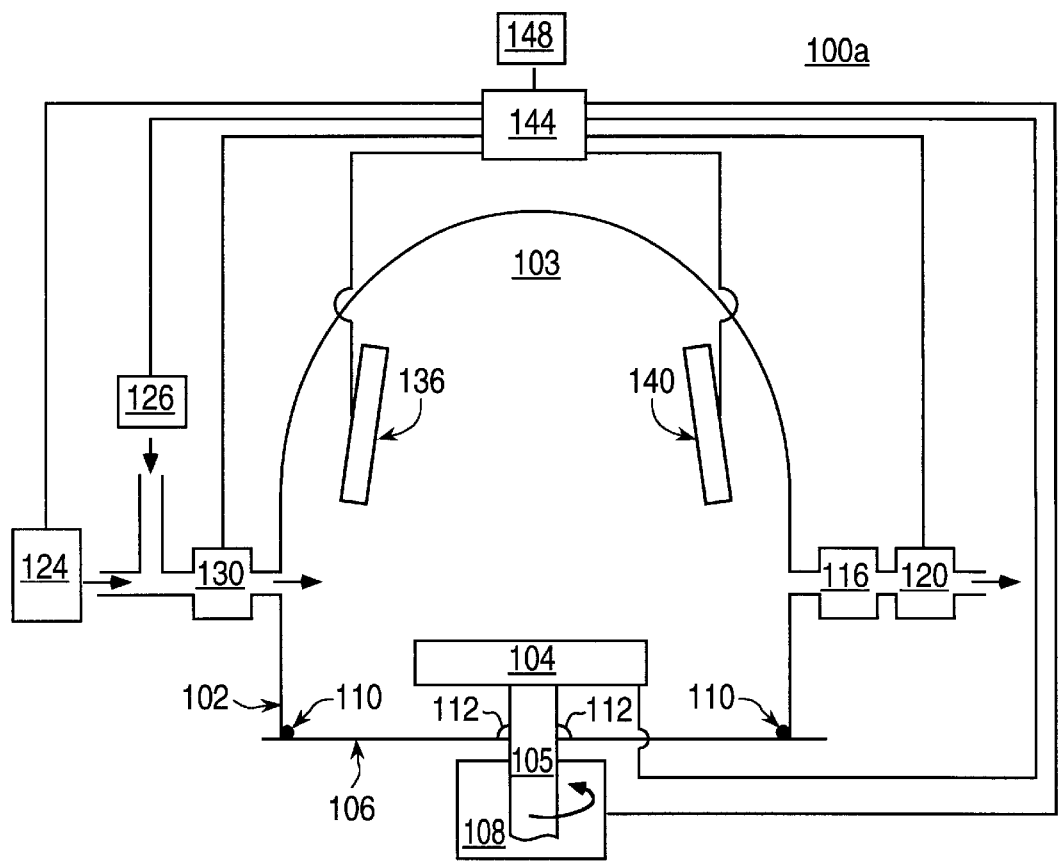
FIGS. 1a and 1b are block diagrams two deposition chambers used for the manufacture of spin-on thin films of this invention.

The improved processes of this invention can be advantageously carried out in a closed deposition chamber containing the wafer, the chuck, ports for introducing precursor solutions, environmental gases, and devices for regulating pressure and temperature during the manufacturing processes. The deposition apparatus shown in FIG. 1a comprises a deposition chamber 100a comprising a bell 102 sealed onto a support platform 106 with seals 110 capable of containing the gases in the chamber space 103 during the low and high pressures that exist during deposition of the spin-on materials. The bell 102 can be made of any convenient material which is inert to the chemicals used in spin-on deposition. Such materials can be, by way of example only, quartz, glass or stainless steel. The size of the bell should be sufficient to enclose the chuck, wafer, and can also, if desired, accommodate the solution dispensing apparatus for scan dispensing spin-on solutions. A pump 120 is used to decrease the pressure in chamber space 103 if desired, and to exhaust gases from the chamber. A cold trap 116 is used to prevent solvents and/or precursors from contaminating the pump 120 and to prevent environmental contamination.

The gas composition within chamber space 103 can be regulated by a bias gas inflow source 124, which typically uses an inert gas such as nitrogen, helium, argon or similar gas. Inert gases can minimize the oxidation of the dielectric material, thereby decreasing the dielectric constant of the resulting thin film. To increase the solvent vapor pressure in chamber space 103, a solvent injector 130 is used. Solvent injector can be a bubbler to volatilize liquid solvents, or an injector to directly place solvent into the bias gas flowing into the deposition chamber. These types of solvent injection devices are known in the art and will not be described further. The temperature inside the deposition chamber can be increased by heaters 136 or can be decreased by coolers 140. The heaters can be any conventional type, including resistive heaters or infrared lamps known in the art. Coolers 140 can be radiative coolers using cold air, cooling liquids such as, by way of example only, freons or other refrigerants such as cold water. A chuck 104 capable of rotation about its central axis is shown. The spindle 105 is typically sealed using a gasket 112, which can be made of any chemically inert material suitable for maintaining the pressure within the chamber space 103. By way of example only, the gasket 112 can be made of stainless steel, silicone polymers, or other materials known in the art. The evaporation of solvents from the wafer can be slowed by cooling the wafer and chuck 104 by conventional means, by way of example only, the reverse Peltier effect. Alternatively, the chuck 104 can be cooled using a cooling fluid such as, by way of example only, cold water, freons and other refrigerants, or cold air. Alternatively, the chamber space 103 can be cooled adiabatically by using the bias gas stored under pressure and released into the chamber at a pressure lower than the storage pressure of the gas. Further adiabatic cooling can be accomplished by lowering the pressure in the chamber space 103 using pump 120. Moreover, the temperature in the chamber space 103 can be decreased using a cooled bias gas 126.

The pump 120, bias gas inflow apparatus 124, bias cooling gas 126, the solvent injector 130, the heaters 136 and coolers 140, and the chuck cooling devices can be separately controlled using a processor 144 which can be attached to a memory device 148 which can store a program to regulate the conditions within the chamber space 103, the rotation, and the temperature of the chuck 104. In operation, the bell 102 can be raised to permit the installation of a wafer on chuck 104. The bell is then lowered onto platform 106 and the pressure is maintained by seals 110. Within the closed deposition chamber the physical and chemical conditions for the deposition are adjusted as desired. After deposition of a spin-on layer, the bell 102 is raised and the wafer removed for subsequent processing.

Figure 1B:
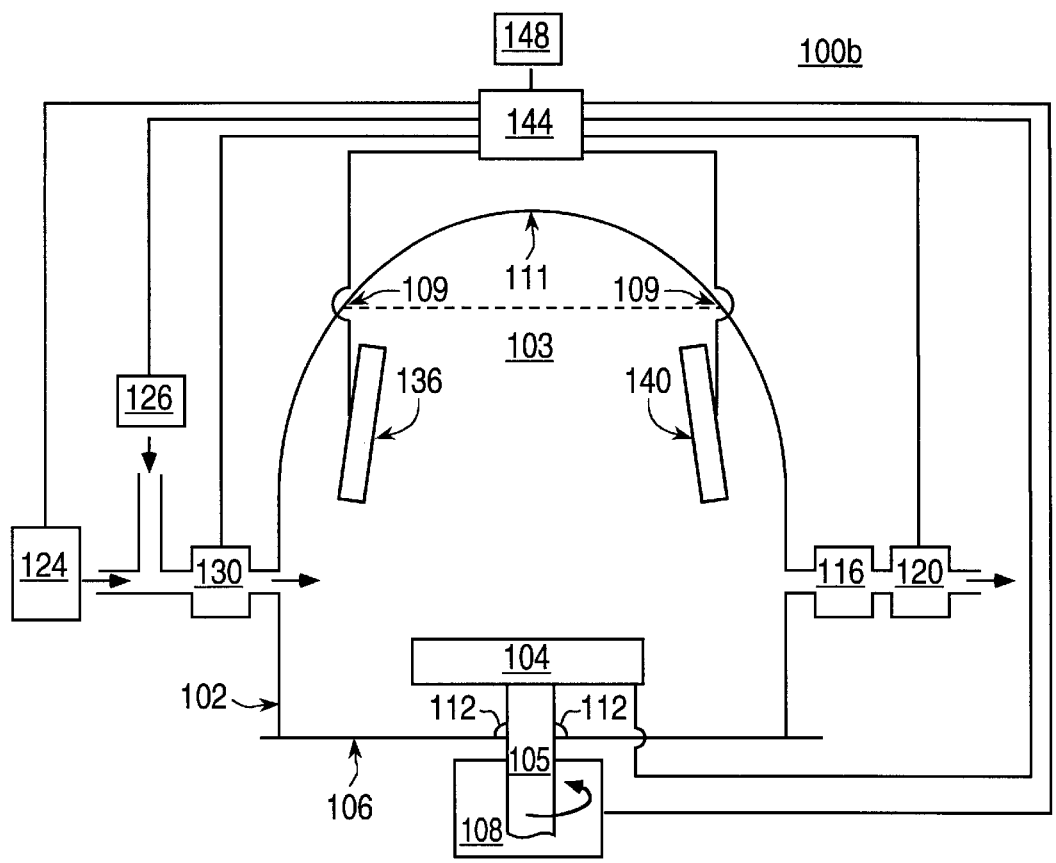

In an alternative embodiment, shown in Figure 1b, the deposition chamber can be designed with the lower portion of the device being made as a unit, with the base 106, sidewalls of the bell 102, the bias flow port and the pump port, the heaters 136 and coolers 140 being attached to the base 106. In this embodiment, a removable top portion 111 is provided to permit access to the interior of the deposition chamber. When a wafer is placed on the chuck 104, the top 111 is lowered onto sidewalls 102, and seals 109 maintain the pressure within the chamber space 103.

In operation, a wafer can be placed on the chuck 104, and can have an aliquot of precursor solution placed on the wafer. The deposition chamber can be closed and the temperature, pressure, and gas composition can be set to desired conditions for the spin steps. The application of precursor solution can be by any method known in the art, but a preferred method is to apply the precursor solution using a scan-dispense methods of this invention described below (for example, FIG. 2).

One of the advantages of this closed deposition system is the ability to regulate the evaporation of solvents during dispensing, rapid spinning, solution flow-in and solvent evaporation (drying) steps. If the solvent evaporation rates are too high, then the residual deposited material can crack, decreasing dielectric strength and mechanical strength. These changes result in shorter lifetimes for semiconductor devices.

For certain solvents with high volatility such as naphtha, methylisobutylketone (MIBK), or n-methylisobutylketone (NMIBK), the solvent can evaporate rapidly from the surface of the wafer where the solution was dispensed first, leaving behind a more viscous solution containing a higher concentration of dielectric precursor. In contrast, in areas of the wafer where the solution is dispensed later in time, there is less time for the solvent to evaporate, and the solution is therefore less concentrated and less viscous. During the subsequent rapid spinning step, the less viscous solution can spread to a higher degree than the more viscous solution. The differences in spreading behavior of the solutions with different viscosity can result in a build-up of materials in the middle of the wafer producing non-uniformity of the final spin-on layer. This is especially true for solutions dispensed form the center of the wafer to the outer edge.

Therefore, to slow the rate of evaporation, it is desirable to: 1) reduce the rotation speed of the wafer during the dispensation of precursor solution, 2) increase the pressure within the deposition chamber, 3) increase the partial pressure of the solvent in the deposition chamber, and/or 4) reduce the temperature of either the deposition chamber or the wafer. Reducing the rate of evaporation of solvent from the solution minimizes the increase in precursor concentration and viscosity of the spin-on solution. As a result, the solution can be thinned and evened in a more controlled fashion.

A. Regulation of Rotation Speed.

One way to reduce the rate of evaporation of solvents from a wafer is to select a slow rotation speed during the dispensing step. By using a slow rotation speed, there can be less exchange of bulk chamber gas with the layers of gas near the wafer's surface. At low rotation speeds, the concentration of solvent can increase in the layers near the wafer surface, thus providing an increased rate of diffusion of solvent from the gas phase to the liquid phase on the wafer. This decreases the net rate of solvent loss from the wafer surface. Typically, during dispensation using the present system, the wafer rotation speed is in the range of about 100 rpm to about 500 rpm, in one example, about 200 rpm.

B. Regulation of Pressure Within the Deposition Chamber.

Another way of slowing solvent evaporation is to select a pressure greater than atmospheric pressure within the deposition chamber. Increasing the total pressure of gas reduces the concentration of solvent in the gas phase necessary to reach a given vapor pressure. Thus, the diffusion of solvent gas back into the liquid phase on the wafer surface is increased by increasing total pressure. Therefore, in one aspect of this invention for solvents with high volatility, it can be advantageous to increase the pressure in the chamber from about 760 Torr (1 atmosphere) to about 1520 Torr (2 atmospheres), and in one example, in the range of about 1140 Torr (1.5 atmospheres) to about 1520 Torr (2 atmospheres), and in another example about 1520 Torr (2 atmospheres).

C. Regulation of Solvent Vapor Pressure.

Alternatively, in another aspect of the invention for use with highly volatile solvents, it can be advantageous to add solvent into the deposition chamber to provide an increased solvent vapor partial pressure. This can be done using the solvent injector 130. It is advantageous to use solvent vapor pressures in the range of greater than about 0% of the ambient pressure to about 99% of the ambient pressure, in one example in the range of about 10% to about 90%, in another example from about 40% to about 60%, and in yet another example from about 20% to about 30%. However, it can be appreciated that solvents with lower volatility do not require the vapor partial pressure to be as high as that for solvents with a higher volatility to achieve similarly reductions in the rates of solvent evaporation.

D. Regulation of Chamber Temperature.

Moreover, in another aspect of this invention, decreasing the temperature within the chamber to below room temperature also can reduce the evaporation of solvents which are highly volatile at room temperature. In general, to decrease the evaporation rates of solvents commonly used for spin-on deposition, it is advantageous to carry out deposition steps at a temperature to below about ¾ of the boiling point of the solvent in Kelvins. Thus, for a solvent such as methylisobutylketone, whose boiling temperature is about 423 Kelvins (150° C.), maintaining chamber temperature in the range of about 253 Kelvins (−20° C.) to about 293 Kelvins (about 20° C.), and in a specific example, about 283 Kelvins (10° C.) provides for an evaporation rate sufficiently low to permit proper thinning during the rapid spin step. Moreover, for many precursor/solvent solutions, decreasing the temperature can increase the viscosity of the solution. If the temperature is decreased too much, the viscosity of the solution can increase too much, and the handling the solutions, including the dispensing steps can become difficult. Conversely, for solvents which are not as volatile as naphtha or methylisobutylketone, a higher temperature in the chamber can be advantageously used without an undesirably high rate of evaporation. Therefore, it is desirable to choose conditions of wafer rotation speed, pressure, temperature and solvent vapor partial pressure to optimize the dispensation and thinning of spin-on solutions.

II. Dispensing Spin-On Solutions

A. Selection of Solutions.

Any material in solution form can be applied using the method of this invention. However, for application of low dielectric constant dielectrics, the precursor hydrogen silsesquioxane (HSQ) is suitable. In addition to HSQ, other low dielectric constant materials can be scan spin dispensed using the methods of this invention include, by way of example only, benzylcyclobutene (BCB), perfluorocyclobutene (PFCB), poly(arylene)ethers, fluorinated poly(arylene)ethers, polyimides, fluorinated polyimides, poly(tetrafluoroethylene), polyethylene, and hybrid-silsesquioxanes.

Any solvent known in the art to dissolve a selected precursor can be used using these methods. In general, it is desirable to select a solvent which is environmentally safe, can solubilize the precursor to achieve a solution of the desired precursor concentration, is commercially available, and can evaporate sufficiently rapidly. The typical solvents used for dissolving spin-on glass, HSQ, BCB, poly(arylene)ethers, and fluorinated poly(arylene)ethers include, by way of example only, isopropanol, naphtha, MIBK, NMIBK, and mesitylene, among others. Additionally, any other solvent which can sufficiently dissolve the precursor, and can be removed from the surface by evaporation can also be used.

The concentration of solute can be varied to suit the particular needs of the user. For example, solutions with lower viscosity and higher wetting properties can flow into gaps more easily than solutions with higher viscosity and lower wetting properties. Moreover, solutions with higher viscosity have a greater tendency to remain at the site of dispensation than solutions with lower viscosity. Because during spinning, the acceleration is greater near the edge of the spinning wafer than in the center of the wafer, solution nearer the edge is subjected to higher acceleration, than the solution nearer the center. Thus, films tend to be thinner near the edge of the wafer and thicker near the center of the wafer. Typical solutions include HSQ in MIBK in a concentration range of from about 1% to about 70%, alternatively from about 5% to about 50%, an another example from about 10% to about 20% and in yet another example, about 15%.

B. Scan Dispensing Solutions Onto Wafers.

Another embodiment of this invention is a novel process for dispensing the solution in a more controlled fashion than previous methods (the "scan dispensing" method). For certain precursors such as HSQ and solvents such as naphtha and methylisobutylketone which are volatile, evaporation begins immediately after a portion of solution is dispensed onto the wafer. If the solution is dispensed beginning from the center of the wafer, as is typical of prior art methods, the result is an area of partially dried precursor in the middle of the wafer. As the wafer is subsequently rapidly spun, the centrifugal forces are less at the center of the wafer, and therefore, the layer of solution in the middle of the wafer is thinned to a much lesser degree. This results in a spin-on film that is thicker at the wafer middle and therefore is not planar.

Figure 2:
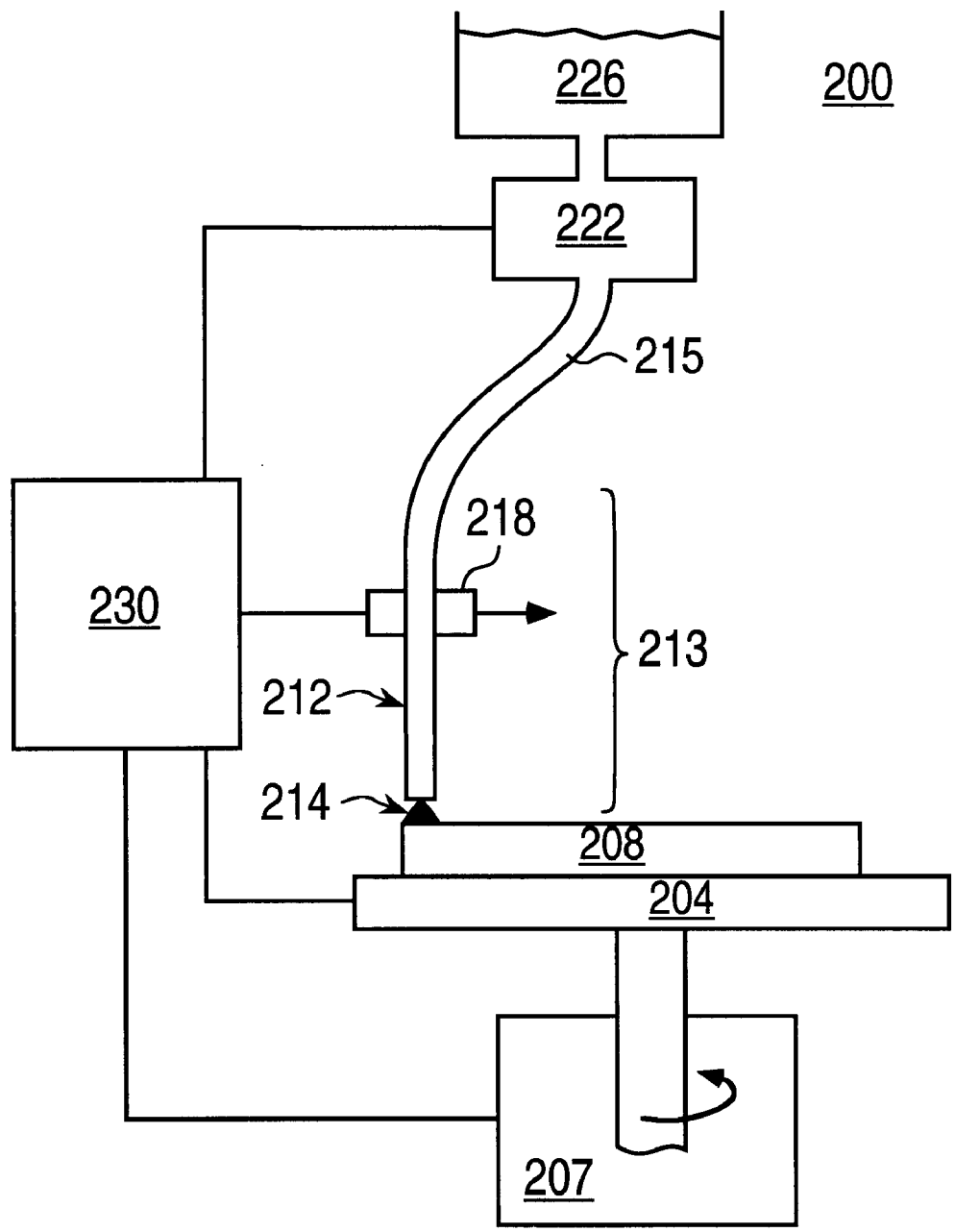
FIG. 2 is a block diagram of the apparatus used to dispense the spin-on solutions of this invention.

To improve the planarity of the spin-on material, in this embodiment of the invention, the solution can be scan dispensed to substantially cover the wafer prior to the rapid spin step. FIG. 2 depicts apparatus used to dispense spin-on coatings of the invention. Chuck 204 can be cooled using methods known in the art, such as the reverse Peltier effect or fluid cooling, using, for example, freons, cooled water, or other refrigerants known in the art. Chuck 204 is adapted to hold wafer 208 which has an upper surface on which the spin-on layer is to be deposited. The chuck and wafer are depicted as rotating in the direction of the curved arrow. The chuck and wafer are rotated by motor 207. Dispensing nozzle 212 provides the flow of precursor solution to form a bead 214 on the wafer. The dispensing nozzle 212 is part of a dispensing arm 213 which is moved by a dispensing arm actuator 218 which moves the dispensing arm and nozzle 212 radially across wafer 208 as shown by the linear arrow. The solution is provided by reservoir 226 and is fed into the dispensing arm 213 by a pump 222. The precursor solution flows through flexible tube 215 and into the dispensing nozzle 212.

The movement of dispensing nozzle 212 can be in either the centripital direction shown, from the edge of the wafer to the center, or in a centrifugal direction, from the center of the wafer to the edge. The movement of dispensing arm actuator 218 can be controlled by processor 230, for example, a microprocessor which is capable of running a program stored in a memory device (not shown) to enable the desired movement of dispensing arm 212 over wafer 208 to dispense a bead 214 of the desired width. The pump 222 can also be controlled by processor 230 to provide the desired flow rate of precursor solution through dispensing arm 212 through a nozzle and onto wafer 208 to dispense a bead 214 of the desired configuration. Moreover, the rotation velocity and the temperature of the chuck 204 and wafer 208 can be controlled by processor 230 during the dispensing step to regulated the thickness of the bead of solution.

Optionally, dispensing arm 212, pump 222, and/or chuck 204 can be regulated in a coordinated fashion to permit the simultaneous regulation of the movement of dispensing arm actuator 218, the flow rate of pump 222, and/or chuck 204 to achieve the desired configuration of bead 214.

In one aspect of this embodiment, the solution is deposited first near the edge of the wafer, and the solution is progressively deposited toward the center of the wafer ("edge scan dispense" method; see Example 1). The solution can be advantageously dispensed onto the wafer while the wafer is rotating at a low rate of speed. During dispensation, the dispensing nozzle 212 moves toward the center of the wafer, thus resulting in a spiral-shaped bead of solution 214 covering the surface of the wafer.

For certain highly volatile solvents such as naphtha or methylisobutylketone, by depositing the solution first at the outer edge, evaporation of solvent after dispensing can result in a more viscous layer of material at the outer edge of the wafer. This is because as the dispensing arm moves progressively toward the center of the wafer, there is progressively less time available for solvent evaporation for the first-dispensed solution compared to the later-dispensed solution. This results in an uneven distribution of precursor concentration in the dispensed solution, with a parallel, uneven viscosity of the layer decreasing progressively toward the center of the wafer. Thereafter, during the rapid spinning step, where the centrifugal forces are highest at the periphery of the wafer, the layer of solution is more viscous and more consolidated, and therefore does not thin as much as in prior art methods. In contrast, at the center of the wafer, where the centrifugal forces are smaller than at the outer edge, the solution is less viscous, and is thinned more easily. Thus, the differences in viscosity of the solution at the edge compared to the center of the wafer at least partially compensates for the differences in centrifugal forces to which the solution is subjected, and as a result, the within wafer non-uniformity of the thickness of the thin film is substantially reduced, thereby improving the quality of the spin-on thin film.

For certain other solvents which are not as volatile as methylisobutylketone, it can be desirable to dispense an even layer of solution on the wafer prior to the rapid spinning step. Using the methods of this invention, the amount of solution dispensed on each portion of the wafer can be carefully regulated, thereby resulting in a layer of solution of uniform thickness.

The speed with which the nozzle moves between the center and edge of the wafer and the rotation velocity of the wafer determines the distance between successive lines of the spiral bead of solution. For a given nozzle velocity, as the speed of wafer rotation increases, the distance between the successive beads of solution decreases. Moreover, for a given wafer rotation speed, increasing the velocity of nozzle movement increases the distance between beads. Further, as the flow rate of solution from the nozzle increases, the width of the solution bead increases. By increasing bead width, the distance between successively applied beads of precursor solution can be increased without resulting in the formation of spaces of precursor-free wafer between the successively applied beads. In general, it is desirable to provide an even, complete layer of solution prior to the high speed spin step. Thus, during the solution dispensing step, the rotation speed, solution flow rate and nozzle speed are controlled so that the edges of the bead of solution overlap the edges of adjacent beads. By completely covering the wafer, the solution has opportunity to penetrate into the gaps in the features to provide better coverage and adherence of final film to the wafer.

The control over the thickness and evenness of the dispensed solution can be regulated by controlling: 1) precursor solution flow rate, 2) movement of the dispensing nozzle over the wafer, 3) wafer rotation speed, and 4) the rate of evaporation of solvent from the surface of the liquid film. By using these methods, it is possible to achieve global non-uniformity of a patterned wafer of less than about 20%. In fact, in some cases, the global non-uniformity can be 5% or less. In contrast, using methods of the prior art, global non-uniformity is much greater, being about 20% or higher. Thus, using the methods of this invention, global planarity can be improved by about 4 times or even greater.

1. Control of Dispensing Flow Rate.

The precursor solution can be dispensed onto the wafer using any convenient feed device, including, but not limited to conventional liquid pumps or gas-pressurized dispensing devices. Which type of feed device advantageously used can depend on the physical properties of the solution. For solutions which have a viscosity in the range below about 10 centipoise (cp), the preferred feed device comprises a pressurized solution reservoir with an inert feed gas, such as helium or nitrogen, to provide the pressure necessary to initiate and maintain solution flow onto the wafer. In this type of feed device, the solution flow rate is controlled by regulating the pressure of the feed gas within the reservoir. By way of example only, a typical low viscosity solution comprising about 10% to about 20% HSQ in methylisobutylketone has a viscosity in the range of about 5 to 7 cp. In contrast, for solutions which have a viscosity in the range of above about 10 to 15 cp and higher, a feed device using a conventional liquid pump 222 and reservoir 226 is advantageously used (FIG. 2). By way of example, a typical high viscosity solution can comprise about 20% to about 40% BCB in 1, 3, 5-trimethylbenzene. In a preferred embodiment using a gas-pressurized device, a reservoir of solution in a pressure-sealed chamber is overlayed with an inert gas such as helium, and the pressure in the dispensing chamber is increased by use of a pump or other pressure source. The flow rate of the solution out of the dispensing device is regulated by the gas pressure within the device. Increasing the pressure of the gas within the device increases the flow of solution out of the device. Additionally, a flow regulator can be used to provide further control over solution flow rate.

The pressure necessary to dispense the solution varies, with solutions of higher viscosity requiring higher pressures to generate the same flow rate as solutions with lower viscosity. Typically, dispensation pressures are in the range of from about 0.1 pounds per square inch (psi) to about 20 psi, alternatively from about 1 psi to about 10 psi, and in another example, from about 3 psi to about 4 psi. When the nozzle reaches the center of the wafer, flow of solution ceases and the nozzle is removed from the wafer.

The flow rate of solution onto the wafer can vary, depending on the surface tension of the liquid and the wetting behavior of the solution on the wafer surface. With solutions with lower surface tension and/or better wetting behavior, less solution is required to achieve a desired bead width. Conversely, for solutions with higher surface tension and/or poorer wetting behavior, more solution will be needed to achieve a desired bead thickness. Typically, the desired solution flow rates are in the range of about 0.1 ml/min to about 20 ml/min, alternatively from about 1 ml/min to about 10 ml/min, and in another example, from about 3 ml/min to about 4 ml/min. for solutions of about 10% to about 20% HSQ in MBK.

At a given flow rate, the duration of the dispense step can be varied to achieve the desired coverage of the wafer. In general, the duration of dispersing can vary, typically in the range of from about 100 μsec to about 30 sec, alternatively from about 100 μsec to about 10 sec, and in another example, about 2 seconds for HSQ/MIBK. By way of example only, Example 4, FIGS. 4a, 4b and 4c show the results of experiments to determine the optimum time for dispensing HSQ/MIBK solution. The range of film thickness (FIG. 4a), the standard deviation of the range (FIG. 4b) and the wafer non-uniformity (FIG. 4c) are minimized by using a dispense time of about 1.2 seconds. Using similar testing methods, it is routine to determine the optimum dispense time for any desired solution of solvent and precursor. Using similar test strategies, it is possible to determine the optimum dispensing time for any particular combination of solvent, precursor, and wafer size.

Within these ranges, to achieve an even thickness of solution on a wafer, it is necessary to have higher flow rates of solution applied to portions of the wafer near the edges. This is because the width of a bead of solution is smaller as the linear velocity of the wafer is higher near the wafer's edge. To achieve a consistent bead width and an even layer of solution, it can be advantageous for the ratio of solution flow rate to linear velocity of the wafer under the nozzle be held approximately constant. This can be accomplished by progressively decreasing the flow rate as the nozzle moves toward the center of the wafer. If a thinner layer of solution at the wafer center is desired, this can be accomplished by decreasing the flow rate even more, so that the ratio of flow rate to linear velocity of the wafer decreases as the nozzle moves to the center of the wafer. Alternatively, in those situations where the solution is dispensed beginning at the center of the wafer, the flow rate of solution can be progressively increased as the nozzle is moved more towards the wafer edge.

In alternative embodiments of the invention, the flow rate of the solution onto the wafer and/or the movement of the dispensing nozzle over the wafer surface during the step of dispensing can be controlled using a processor to control the dispensation of precursor solution to provide a desired thickness of solution on the wafer. The processor is attached to the dispensing arm actuator, a solution pump is system, or both. In those embodiments in which the processor controls the dispensing pump, at the beginning of the dispensation step at the outer edge of the wafer, the flow rate of solution is adjusted to be sufficiently high to provide a desired bead thickness over the surface of the wafer at that location, which has a higher linear velocity relative to the linear velocity at sites more toward the center of the wafer. As the dispensation arm moves centripetally toward the wafer center, the linear velocity of the wafer under the dispensation arm decreases. Therefore, in one method of this invention, one can decrease the amount of solution to be pumped onto the wafer to maintain a desired bead thickness. When the dispensing arm reaches the center of the wafer, the flow rate of solution is decreased to about zero. Alternatively, if the solution is applied beginning at the middle of the wafer, the processor can be directed to increase the flow rate of solution as the dispensing arm is moved progressively more centrifugally toward the wafer edge.

The processor can use Algorithm 1 to provide output to the control elements of the apparatus.

$$D(t) = 2 \cdot \frac{AT}{R^2}(R - Va \cdot t), \quad \text{where} \qquad \text{Algorithm 1}$$

$$T = \frac{R}{Va}$$

and where:

D(t) is the dispense function wherein at the time of t=0, with the dispensing arm at the edge of the wafer, and where at the time of t=T, the dispense arm is at the center of the wafer. The variables in the dispense function are as follows:

A is a constant depending on the total volume of fluid dispensed onto the wafer;

t is the time in seconds;

T is the total time in seconds for dispensing the slurry;

R is the wafer diameter in meters; and

Va is the linear speed (in meters/sec) of the dispensing arm.

2. Regulation of Dispensing Arm Motion By Processor.

In an alternative embodiment in which the rate of movement of the dispensation arm is controlled by a processor, at the periphery of the wafer, the dispensation arm moves centripetally or centrifugally, and the speed of its movement is regulated to compensate for the different linear velocity of the wafer surface under the nozzle. At a given solution flow rate, because the linear velocity of the wafer under the dispensing arm is higher at the edge of the wafer, the bead of dispensed solution will be relatively narrow compared to a bead dispensed onto a portion of the wafer which moves more slowly. Thus, in an embodiment in which the solution is applied first near the edge ("edge-scan dispense" method), to maintain overlapping beads on successive rotations of the wafer, while near the edge of the wafer the dispensing arm should be moved only slowly toward the center of the wafer. However, as the dispensing arm moves progressively centripetally, the linear velocity of the wafer under the arm decreases, so that at the same given flow rate of solution, the width of the bead will increase. Thus, the movement of the dispensation arm can be controlled to provide an increasing distance between successive bead centers, which results in overlapping bead edges. Alternatively, if the solution is applied first near the center of the wafer, the rate of arm movement can be lower near the center than the rate of movement as the arm nears the wafer edge. R and Va are defined as above. Typically, the total time T (in seconds) for dispensing slurry, and the wafer rotation speed υ (in rotations per minute), are related by the following formulas:

$$T \cdot \upsilon > 60. \qquad \text{Algorithm 2}$$

$$Va(t) = \frac{R - r(t)}{t}; \quad \text{for } t = 0 \Rightarrow T,$$

where r is the distance of the arm from the center of the wafer.

It can also be advantageous to regulate both the solution flow rate and the dispensing arm motion simultaneously. Moreover, when the dispensation of precursor solution is controlled as described above, the dispensation arm can be moved either centripetally, from the edge toward the center, or centrifugally, from the center of the wafer to the periphery, and still maintain the desired thickness of the precursor solution on the wafer.

3. Control of Wafer Rotation Speed During Dispensing Step.

Typically, in the preferred edge scan dispense method, the rate of rotation during the dispensing step is from about 50 to about 500 rpm, in one example, about 200 revolutions per minute (rpm) with a constant flow rate of solution onto the wafer surface. By way of example only, Example 4, FIGS. 5a, 5b and 5c show the results of experiments designed to determine the optimum dispense speed for dispensing a solution of HSQ in MIBK, wherein the solution flow rate was held constant. The range of film thickness (FIG. 5a) standard deviation (FIG. 5b) and wafer non-uniformity (FIG. 5c) are minimized by using a dispense spin speed of about 200 rpm. Using similar testing methods, it is routine to determine the optimum dispense time for any desired solution of solvent and precursor.

However, it is also considered part of the invention to control the rotation speed of the wafer during the dispensing step to compensate for the differences in solution dispensation which result from the differences in linear velocity of the wafer surface at different locations radially from the wafer center. For example, if the solution flow rate and dispensing arm motion are held constant, increasing the rotation speed as the dispensing arm moves centripitally operates to maintain the linear velocity of the wafer under the dispensing arm (Algorithm 3).

$$\upsilon(t) = \frac{C}{2\pi r(t)} \qquad \text{Algorithm 3}$$

where C is a constant and where r(t)=R−Va·t, for t=0→T.

This could result in the dispensing of a bead of solution with an even width, thereby permitting the dispensation of an even, overlapping bead as the dispensing arm moves centripitally. Alternatively, if the dispensing arm is moving centrifugally, from the center of the wafer toward the edge, the wafer rotation speed can be slowed advantageously to maintain an approximately constant linear velocity of the wafer under the dispensing nozzle, thereby dispensing an even bead of solution as the dispensing arm moves at constant speed.

4. Control of Solution Thickness.

The ability to provide layers of solution with different thicknesses depends upon the viscosity of the solution and the pattern of dispensation. Less viscous solutions will flow more readily, thus decreasing variations in the thickness of the dispensed solution. Conversely, more viscous solutions will tend to remain at the sites dispensed, and can therefore retain differences in solution thickness.

It is also within the scope of this invention to vary the thickness of the dispensed solution in any other desired fashion. Because the acceleration acting on the solution during the fast spin step are greater at the edges than at the middle of the wafer, it can be desirable to provide a thinner layer of solution at the center of the wafer than is dispensed at the edge of the wafer. In general, the thickness of a solution retained by a spinning wafer will depend on the distance from the center of rotation. Points on a wafer closer to the center of rotation will retain more material than points farther from the center of rotation. The amount of material lost from any particular point on a wafer also is dependent on the solution's viscosity. The higher the viscosity, the more retention at the particular site. Therefore, using the methods of this invention, it is possible to provide very even layers of spin-on solutions.

The total amount of solution needed depends upon the solution concentration, the diameter of the wafer, and the desired film thickness. In general, the minimum amount of solution is about $10^{-2}$ ml/π·cm$^2$. Thus, for a wafer with a diameter of 8 inches, about 1 ml to about 10 ml of solution typically can be used, and alternatively about 4 ml of solution, which is usually sufficient.

The dispensing step can be carried out using any other conventional processing methods. However, to control the deposition of spin-on layers more advantageously, it is preferred that the above dispensing methods be carried out within a sealed deposition chamber as described above in section I.

III. Rapid Spinning Step

A. Rapid Acceleration to High Maximum Spin Speed.

Figure 3B:
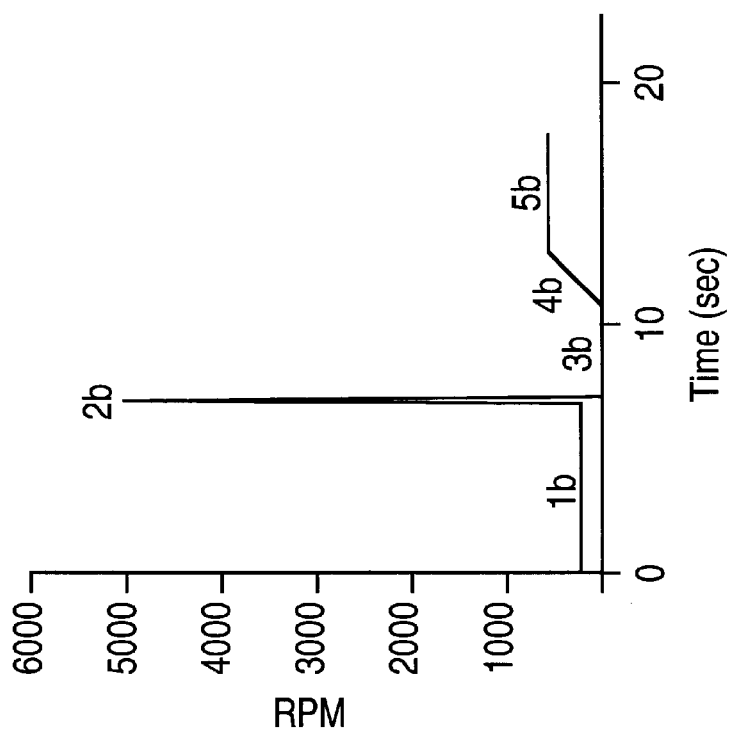
FIG. 3b is a graph of spin speed versus time for another embodiment of the invention.
Figure 3A:
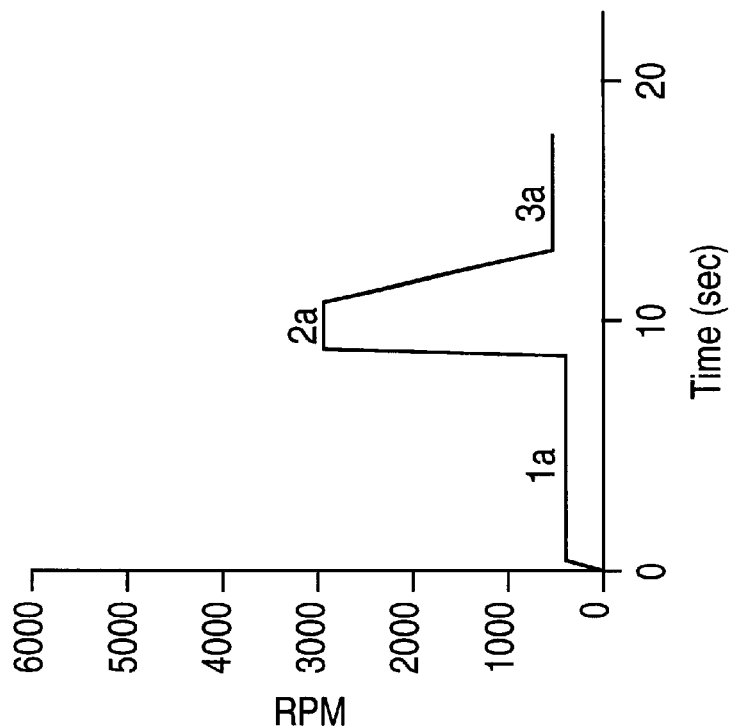
FIG. 3a is a graph of spin speed versus time for one embodiment of the invention.

To even and thin the layer of spin-on solution, the wafers are then subjected to a fast spin step (Example 1, FIGS. 3a and 3b). In this step, the wafers are subjected to rapid acceleration, short duration of high speed rotation, and rapid deceleration. In one embodiment, a less rapid spinning (FIG. 3a) and lower maximum rotation speed do not provide as thin and even a thin film. In the preferred embodiments of this invention, the wafers are accelerated to their maximum spin speed rapidly, at accelerations in the range of from about $10^3$ rpm/sec to about $2.5 \times 10^8$ rpm/sec, alternatively from about $10^3$ rpm/sec to about $10^8$ rpm/sec, and in another example, at about $5 \times 10^5$ rpm/sec.

In general, the rotation speed is inversely related to the thickness of the film, with higher maximum spin speeds resulting in thinner films. The degree to which a given precursor solution is thinned during the rapid spinning step depends upon the viscosity of the solution, with more viscous solutions resulting in thicker films for a given maximum rotation speed than for solutions with lower viscosity. The maximum spin speed should be from greater than about 500 rpm to about 12,000 rpm, in one example, from greater than about 1000 rpm to about 8000 rpm, and in another example from about 4000 rpm to about 6000 rpm. The spin step typically lasts for a time in the range of about 0.05 sec to about 3 sec, alternatively from about 0.1 sec to about 2 sec, and in another example, about 0.1 sec. After spinning, the wafers are decelerated at about the same rates as for acceleration.

We have unexpectedly found that very rapid accelerations and rapid decelerations provide more uniform film thickness than the rates of acceleration used previously. Moreover, we have unexpectedly found that the high rotation velocities permit the production of more even films. Furthermore, we have unexpectedly found that spinning wafers for a short duration at the maximum rotation speed decreases film thickness range (FIG. 6a), standard deviation (FIG. 6b) and film non-uniformity (FIG. 6c). In fact, we found that spinning wafers for 1 second or longer increased the non-uniformity to much higher levels than using spin times of less than 1 second. Therefore, by using the combination of rapid acceleration, high rotation velocity, short duration of maximum rotation, and rapid deceleration, the reproducibility and evenness of spin-on thin films of this invention are improved.

Although the exact mechanism for this improved film quality are not known with certainty, one theory to account for the observation is that with the short duration of the spin step, there is little opportunity for the solvent to evaporate, and therefore, when the spinning is stopped, the solution flows to form a more planar configuration. Using the methods of the prior art, long spinning steps permit the partial drying of the thin film before the rapid spin step has been completed. This results in areas of partial drying which do not flow during the rotation step. Therefore, those areas of the film tend to harden in the shape attained during rotation, not a necessarily desired shape. To provide the necessary total spreading, it can be advantageous to use rotation speeds greater than typically used in the prior art. This also minimizes the time needed to spread the thin film. However, for those applications in which the evaporation of solvent is slow, such as with the use of solvents with low volatility, or in which the rate of solvent evaporation is reduced, the rotation speeds can be as low as those currently used.

Although the above theory represents a possible explanation for the results of the present invention, the success of these methods does not rely upon this or any other theory for operability. Many possible reasons may exist for the improved planarity of the thin films of the present invention, and all are considered to be part of the invention.

The spinning step can be performed at any pressure, but if highly volatile solvents are used, it is preferable to slow the rate of solvent evaporation. In one embodiment of the invention, reducing the rate of evaporation can be performed by using higher than atmospheric pressure. The use of a closed deposition system enables the manufacturer to decrease the rate of evaporation, and can result in a more uniform film thickness. Pressures range from about 1 atmosphere (atm) to about 2 atm, alternatively from about 1.5 to about 2 atm, and in another example, about 1.5 atm. Alternatively, the evaporation can be preformed in a closed system in which vapor of the solvent is introduced into the deposition chamber to decrease the rate of evaporation of solvent from the film.

Using similar procedures as described herein, it is possible to determine the optimum acceleration, maximum spin speed, and deceleration for each type of solvent, precursor, and desired film properties.

IV. Solution Flow-In

After the rapid spinning step, the rotation of the wafer is then slowed (FIG. 3a) or is stopped (FIG. 3b) for a period of time (the "solution flow-in period" or, if the rotation is zero, the "stop time") sufficient to permit even flow-in of solution across the surface of the wafer (FIG. 3b). In prior art spin-on methods with long spin times, there is an opportunity for the solvent to evaporate from the solution. As the solvent evaporates from the wafer during the rapid spinning step, then the final shape of the film will reflect the forces on the solution during spinning. Because during spinning, the accelerative forces are different on different parts of the wafer, the solution is subjected to different forces depending on the distance from the center of rotation. The differences in accelerative forces on different parts of a wafer can cause uneven distribution of solution over the wafer's surface. Therefore, in the prior art spin-on methods there can be a global non-planarity of the thin film.

In addition to providing more globally planar thin films, the methods of this invention permit the manufacture of semiconductor thin films with improved local planarity. Local non-uniformity occurs with respect to the pads or metal lines on a patterned wafer or semiconductor device. Using conventional spin-on methods, as the precursor solution flows over and between metal features on the wafer, there is a tendency for the solution to form a thicker layer at the centrifugal side of the metal feature compared to the centripital side of the feature (see FIG. 9). Conversely, there is a tendency for the solution to form a thinner layer over the centripital side of the feature. This local non-uniformity can result in local variations in physical and electrical properties of the thin film. Using conventional spin-on methods, the thickness of thin film at the centrifugal side of the pad can be twice or more the thickness of the film on the centripital side of the pad.

The global and local non-uniformities are at least partially overcome by the use of a flow-in step. By removing the unequal accelerative forces to which the solution is subjected in a radial direction from the wafer's center, the inclusion of a flow-in period prior to solvent evaporation increases the planarity of the solution. Thus, it is important that the precursor solution not be completely dried at the time of the flow-in step. Although a flow-in step can be used to increase the planarity of any spin-on solution, it is advantageous to also use the sealed deposition chamber, the scan dispensing methods, the rapid acceleration, short maximum spin times, and rapid deceleration of other embodiments of this invention. By using these other improvements, the planarity of the spin-on films can be increased.

The local non-uniformity of a layer on a pad or feature of a patterned wafer can be expressed as the difference in the maximum thickness minus the minimum thickness of the layer on the same pad or feature. This difference, or range, is typically greater than about 600 Å for prior art spin-on methods. However, using the methods of this invention, the local non-uniformity is generally below about 600 Å, in another example, below about 400 Å, and in yet another example, below about 300 Å.

The wafer can be rotated during flow-in if the rate of rotation is sufficiently slow as to avoid subjecting the solution to forces which would maintain an uneven distribution of the solution on the surface. However, the wafer can be stopped during the flow-in period. In general, the flow-in period is sufficiently long to permit the thinned solution to flow in the absence of the high forces to which the solution is subjected during the rapid spin step. The flow-in period is selected depending on the physical properties of the solution used. For more viscous solutions, the flow-in period can be longer than for solutions with lower viscosity because longer periods of time permit the solution to penetrate into gaps more completely. Conversely, for solutions with lower viscosity, a shorter flow-in period can be sufficient. Additionally, the wetting behavior of the solution affects the spreading of the solution onto the wafer surface. Solutions which wet the surface more readily may require a shorter flow-in period than solutions which do not wet the surface as readily. Moreover, when the rate of solvent evaporation is reduced by increasing pressure, increasing solvent vapor pressure, or decreasing temperature, the solution flow-in period can be increased in duration.

During the flow-in period, it can be desirable to slow the rate of evaporation from the solution. Such slowing of evaporation can permit the more even flow-in of the spin-on solution. Slowing may be accomplished by selecting the pressure within the chamber, the temperature, and/or the solvent vapor pressure. In aspects of the invention in which the solvent vapor pressure and the chamber temperature are regulated, the pressure within the deposition chamber may be advantageously increased. Generally, for HSQ and MIBK, the pressures are in the range of from about 1 atmosphere (atm) to about 2 atm, in one example from about 1 atm to about 1.5 atm, and in another example about 1.5 atmosphere.

In other aspects of the invention high solvent vapor pressure is used in the chamber during the flow-in period. For certain highly volatile solvents, if the layer of solution partially dries during the rapid spinning step, the viscosity of the solution may be so high as to inhibit effective flow-in. Under these circumstances, the introduction of solvent vapor can either: 1) slow the drying of the solution, or 2) re-dissolve precursor which has already dried onto the wafer. The result of these steps is the improvement in the evenness of the spin-on layer. Typically, the solution partial pressure can be in the range of about 0% to about 99%, in one example, about 10% to about 90%, in another example, about 40% to about 60%, and in yet another example, about 20% to about 30%.

The optimum time for the flow in period can be determined for each set of deposition conditions used. Example 4 shows the results of tests comparing the film thickness range (FIG. 7a), standard deviation (FIG. 7b) and film thickness non-uniformity (FIG. 7c) as a function of the stop time for a solution of a spin-on film made from HSQ in MIBK. Under the conditions of these tests, a stop time of about 4 seconds produced the smallest range and standard deviation of film thickness. Unexpectedly, decreasing stop time to 2 seconds or increasing stop time to 6 seconds produced a wider range of film thicknesses, and increased the standard deviations of those thicknesses. Generally, for a HSQ/methylisobutylketone solution comprising about 10% to about 20% HSQ, the solution flow-in period at atmospheric pressure in air will typically be in the range of about 0.5 sec to about 20 sec, alternatively from about 2 sec. to about 10 sec, and in another example, from about 5 sec to about 10 sec. For more concentrated HSQ solutions, the solution flow-in period can be greater than these times. Using similar strategies, the determination of optimum flow-in period for each type of precursor, solvent, and solution concentration can be made using methods known in the art.

V. Subsequent Processing Steps

After the deposition of the precursor solution, several steps can be carried out to: (1) remove solvents, (2) reflow the dielectric material, and (3) cure the thin film. These processes are carried out so as to achieve the final thin film with the desired properties of low dielectric constant, high dielectric strength, and high mechanical strength. These steps are typically carried out by exposing the wafer to progressively higher temperatures for each of the steps. The temperatures to which the wafer is exposed at each step depends on the solvent volatility, the melting temperature of the dielectric material, and the activation energy of the cross-linking bonds responsible for curing the thin film.

For example, if a highly volatile solvent is used, the first step of solvent evaporation can be performed at a relatively low temperature. In contrast, if a solvent of low volatility is used, the temperature is typically higher than for the solvent with high volatility. Second, if the dielectric material has a relatively low melting temperature, by way of example, poly(tetrafluoroethylene), the reflow step can be carried out a relatively lower temperature than that for a dielectric material with a higher melting temperature, by way of example only, $SiO_2$. Third, if cross-linking the thin film is desired, typically higher temperatures are advantageous to break interatomic bonds in dielectric material monomers and permit the reformation of intermolecular bonds between monomers. Thus, in general, for each solvent and spin-on material deposited, the sequence of post-deposition processing steps can be the same. However, the actual temperatures used will depend upon the physical and chemical characteristics of the solvent and spin-on material used. By way of example only, if fluorinated poly(arylene)ether (FLARE) is used as the dielectric material, the solvent evaporation temperature is typically about 150° C., the reflow temperature is about 200° C., and the curing temperature is above about 250° C.

Heating can be accomplished using resistive heaters or infrared radiation sources in the deposition chamber (FIGS. 1a and 1b), in a separate oven, or on a hot plate or other type of heater known in the art.

A. Regulation of the Rates of Solvent Evaporation.

After thin film deposition, the next step is typically to evaporate excess solvents from the film. This can be accomplished in situ, with the wafer in the deposition apparatus, either stationary or while rotating, or alternatively, the wafer can be removed from the spin apparatus and placed in a separate chamber or hot plate. Evaporation can be at reduced pressure, at atmospheric pressure, or at increased pressure. The rate of evaporation affects the uniformity of the resulting film. More rapid evaporation can result in less even film thickness and properties, while slower evaporation can result in more even thickness and reduced stress in the finished thin film. To reduce the rate of evaporation, this step can be carried out at increased pressure, at reduced temperature or in the presence of solvent vapor.

The closed apparatus described above can be used advantageously to regulate the conditions during the evaporation step.

After evaporating the solvent from the wafer surface during the rapid rotation and flow in steps, most of the remaining solvent can be removed in a first baking step by exposing the wafer to elevated temperatures. The temperature desired is dependent upon the solvent to be evaporated. For evaporation times of about 1 minute, for the deposition of spin-on glass and of fluorinated poly(arylene)ethers using cyclohexanone, typical temperatures are in the range of from about 500° C. to about 250° C., in another example, from about 100° C. to about 200° C., and in yet another example, about 150° C. For HSQ dissolved in MIBK, the typical temperature range for evaporation is from about 100°0 C. to about 300° C., alternatively from about 150° C. to about 250° C., and in another example, about 150° C. For BCB dissolved in mesitylene, temperatures for evaporation are in the range of about 100° C. to about 350° C., alternatively from about 160° C. to about 325° C., and in another example at about 160° C. However, it can be appreciated that the evaporation of solvents is dependent on the volatility and boiling point of the particular solvent used. Highly volatile solvents do not require temperatures as high as solvents with higher volatility.

B. Reflow of Spin-On Films.

After the solvents have been substantially evaporated, the remaining spin-on material is consolidated and evened by a reflow step, in which the wafer is subjected to temperatures above those needed for solvent evaporation. Typically, reflow is accomplished in a separate oven or a hot plate after spin-on deposition has been accomplished, but one can perform reflow steps in the deposition chamber if desired. The temperature and time of reflow is dependent on the melting and flow characteristics of the material used. Typically, for spin-on glass, HSQ and of fluorinated poly (arylene)ethers, the reflow step is carried out at temperatures in the range of from about 150° C. to about 350° C., alternatively in the range of about 150° C. to about 250° C., and in another example, about 200° C. However, it can be appreciated that for materials with lower melting temperatures, the reflow step can be carried out at lower temperatures, and for materials with higher melting temperatures, the reflow step can be carried out at higher temperatures. The time necessary can be determined using methods known in the art by measuring film characteristics after the deposition process has been completed.

C. Curing Films.

The final steps in the deposition of a spin-on dielectric layer are curing steps. The curing permits cross-linking of components of the thin film to increase the mechanical strength of the film and increases the useful lifetime of the dielectric layer. Any desired number of curing steps can be used, but we have found that it is advantageous to use at least 2 curing steps, with the second curing step being carried out at a higher temperature than the first curing step. By way of example, HSQ has a caged molecular structure having a backbone comprising alternating silicon and oxygen atoms. When deposited on a surface, the uncured film of HSQ consists of adjacent un-cross-linked HSQ molecules. However, the desired film comprises cross-linked HSQ moieties. Curing the film by creating of cross-linked HSQ molecules involves heating the layer to a temperature that can break some of the chemical bonds between atoms, typically, O—H bonds and Si—O bonds, thereby resulting in reactive moieties which can re-form with moieties of adjacent HSQ molecules, thereby cross-linking the layer. By increasing the temperature and time of the curing step, the degree of cross-linking can be increased. This cross-linking provides higher mechanical and thermal stability of the film, which result in better electrical properties and longer useful device lifetimes.

Other types of dielectric materials can be cured in similar fashions. By way of example, organic polymeric dielectric materials can contain terminal C—H and/or C—O bonds. When these types of bonds are subjected to heating, they can break, forming reactive intermediate moieties, which can react with nearby polymer chains, thereby forming cross-linking.

1. Step Curing.

In one aspect of the invention, the curing is typically performed as part of the overall post-deposition processing steps. After the reflow step, the wafer is subjected to a temperature higher than that of the reflow step. Typically, this can be accomplished by transferring the wafer from the spin deposition apparatus to a curing oven or a hot plate. For example, for HSQ, the range of curing temperatures is between about 250° C. to about 450° C., in one example, from about 300° C. to about 400° C., and in another example, about 350° C. After this first curing step, a second curing step can be carried out at a higher temperature, typically higher than about 400° C. The temperatures can be in the range of about 350° C. to about 500° C., alternatively from about 375° C. to about 450° C., and in another example, at about 400° C.

After the second curing step, a third curing step can be carried out if desired. Typically, the third temperature in the range of about 250° C. to about 450° C., alternatively about 300° C. to about 400° C., and in another example, about 350° C. Similarly, a fourth curing step can be optionally carried out. Typically, the fourth temperature in the range of about 350° C. to about 500° C., alternatively in the range of about 400° C. to about 500° C, and in another example, about 450° C.

It can be appreciated that the multi-step curing methods involve the incremental increase in temperature with each curing step.

It can also be appreciated that for other dielectric materials, the temperature advantageously used to for cross-linked films may be different. In general, the curing temperature should be sufficiently high to break some of the bonds holding the thin film together, but the temperature should not be so high as to break too many bonds. After the film is cured, it is removed from the curing oven and cooled to room temperature.

2. Combination Step-Ramp Curing

In other aspects of this invention, the curing step can be accomplished according to methods described in co-pending U.S. patent application Ser. No.: 09/191040, entitled "Hydrogen Silsesquioxane Cure Process for Manufacturing Low Dielectric Constant Interlevel Dielectric Materials" incorporated herein fully by reference. This method embodies a step curing process followed by a ramp curing step, wherein the temperature is increased progressively to a maximum temperature. By way of example only, a solution of HSQ is deposited on a wafer, is dried, and then the wafer is placed in a pre-heated oven at a temperature of about 300° C. The temperature is then raised at a rate of about 3° C./min until a temperature of about 400° C. is reached. It can be appreciated that certain types of films can be advantageously cured by increasing the maximum temperature to higher than about 400° C. The temperature is then held constant for about 60 minutes, and then the temperature is lowered at a rate of about 3° C./min or less until a temperature of about 300° C. is reached, at which time, the cured wafer can be removed from the curing oven and allowed to cool to room temperature.

In general, the initial temperature is selected on the basis of routine experiments in which a dried thin film is subjected to the step increase in temperature, and the physical and/or chemical properties of the thin film are determined. Such properties include, by way of example only, the types of chemical bonds in the film, which can be determined using Fourier Transformed Infrared (FTIR) Spectroscopy, measurement of film thickness, dielectric constant, dielectric strength, and mechanical strength. To carry out such a series of routine tests, a low temperature is first used, and the film properties are determined and used to compare with the results of subsequent tests. Additional, previously un-cured thin films are exposed to other, higher temperatures, and the film properties are determined. The temperature above which the film properties become undesirable then is used as the starting temperature for the combined step-ramp process. It can be appreciated that the initial temperature can be different for different types of spin-on materials.

It is also desirable to perform the curing steps in an atmosphere of an inert gas, such as nitrogen, argon, neon, helium, or other noble gas. The combination of step-ramp curing and an inert gas environment for heating, high temperature cure, and cooling steps can provide thin films with high mechanical strength and minimized oxidation, therefore leading to thin films having lower dielectric constants, such as below about 3.0.

Additionally, the determination of the desired rate of temperature increase during the ramp step can be determined using a similar strategy as described above for determining the desired initial temperature. It can be appreciated that the ramp rate can be different for different spin-on materials.

It can be appreciated that any spin-on film can be cured in this fashion in which cross-linking is desired. Moreover, it can also be appreciated that the temperature conditions can vary to suit the needs of the particular spin-on material, and the degree of cross-linking desired.

This combination method overcomes the disadvantages of the prior art curing methods in which either the temperature is raised too rapidly, thereby causing stresses in the thin film and the appearance of undesired electrical properties such as increased dielectric constant and decreased breakdown voltage, or the temperature is raised sufficiently slowly, but the total time taken to cure films is prohibitively long.

VI. Methods of Analysis

The thickness of deposited films are determined using any device known in the art. For example, an optical method using an Optiprobe™ system (the name for an optical thin film measurement system manufactured by Thermawave) is satisfactory. Film thicknesses measured using the Optiprobe™ system are generally in the range of from greater than about 20 Å to about 20,000 Å, alternatively from about 2000 Å to about 7000 Å, and in another example, from about 4000 Å to about 5000 Å.

The dielectric constant of the deposited HSQ film is in the range of from about 2.9 to about 4.3, alternatively from about 2.9 to about 3.1, and in another example, about 2.9. The dielectric constant of other films, such as poly (tetrafluoroethylene) can be as low as about 1.9.

The global nonuniformity of layers is determined using any method known in the art. For example, using the optical method using the Optiprobe™ system, the measured non-uniformity of layer thickness on blank wafers is in the range of from less than about 0.5% to about 10%, in one example, from about 0.5% to about 5%, and in another example is about 0.5% to about 1%. For wafers with metal interconnect patterns, the global non-uniformity of the deposited layer measured using the Optiprobe™ system is less than about 20%, alternatively less than about 10%, and in another example is less than about 5%. Typically, the global non-uniformity is in the range of from about 5% to about 20%, alternatively from about 5% to about 10%, and in another example is about 5%. This degree of global non-uniformity can be achieved for patterned wafers with unequal sizes of features, such as the heights of metal lines.

Other methods for measuring film thickness and/or non-uniformity can be used, and depending on the particular method, the measured thickness and/or non-uniformity may vary. It is within the scope of this invention for any measurements of within wafer non-uniformity to be included, with the ranges of measured non-uniformity being adjusted to be equivalent to those for the Optiprobe™ system described herein.

Measurement of local non-uniformity is performed by measuring the cross-sectional thickness of a semiconductor thin film. Typically, such measurements are made using scanning electron microscopy. To measure local non-uniformity, a cross-section of thin film over a metal pad is observed, and the film thickness at least 5 points from the centripital, central, and centrifugal portions of the pad are measured. The difference between the maximum film thickness and the minimum film thicknesses are determined. This difference is hereinafter termed the local nonuniformity range. The local nonuniformity range is typically less than about 600 Å, alternatively less than about 400 Å, and in another example, less than about 300 Å. These methods are known in the art and are not discussed further herein.

Fourier Transformed Infrared (FTIR) Spectroscopy, determination of mechanical strength, dielectric constant, and dielectric strength are carried out by methods known in the art, and will not be described further herein.

VII. Manufacture of Semiconductor Devices Using Spin-On Methods

After the spin-on layer has been deposited and cured, subsequent manufacture of semiconductor devices is carried out. For example, another layer of dielectric material can be deposited by chemical vapor deposition (CVD) or other methods known in the art, and subsequently planarized by chemical mechanical planarization (CMP) methods. The planarized surface of the second layer can be the substrate for additional layers of metal lines and ILD materials. By repeating the series of steps, multilayered semiconductor devices can be made.

By providing improved global and local uniformity to deposited thin films, the methods of this invention also permit the use of thinner CVD films than are required by prior art spin-on methods (see Example 5, FIG. 11). This is because there is less overall non-uniformity of patterned wafers (less than about 20%) compared to prior art methods. In contrast, the prior art methods produce films on patterned wafers with substantial global non-uniformity, being about 20% or greater of the total film thickness. With improved uniformity made possible by the methods of this invention, a thinner layer of CVD can be sufficient to fill in the low areas of the spin-on film. Furthermore, a thinner CVD film is sufficient to achieve higher global planarity than are possible using spin-on methods without the further CVD layer and CMP. With thinner CVD films, less deposition time and materials are required to deposit and planarize the CVD) film. In fact, a CVD layer on the highly planar spin-on layers of this invention can be sufficiently planar to permit subsequent manufacturing steps without the necessity for a CMP step. This elimination of the need for CMP during manufacturing can further reduce the equipment cost and ILD materials needed for manufacturing semiconductor devices. Therefore, the manufacturing throughput can be increased and the total cost of semiconductor manufacture can be reduced.

The general descriptions of the methods and thin films of this invention are described further by reference to the following Examples and Figures.

EXAMPLES

Example 1

Deposition of Spin-On Hydrogen Silsesquioxane Thin Films

To deposit a thin film of hydrogen silsesquioxane (HSQ), a silicon wafer was placed in a wafer cassette and subsequently moved to a cool plate maintained at a temperature of 23° C. The wafer was then loaded on a vacuum chuck in a spin-cup. The wafer is then rotated at 200 rpm and the solution dispense nozzle moves to about 25 mm from the edge of the wafer using equipment substantially as described in FIG. 2 above. The solution was dispensed from the nozzle as the nozzle moved centripetally toward the center of the wafer while the wafer was rotated at 200 rpm. When the nozzle reached the center of the wafer, the dispensation of the solution stopped, and at that time, the surface of the wafer was completely covered by the precursor solution.

The wafer was then rotated with an acceleration time of 0.03 seconds to a maximum rotation speed of 5000 rpm. The duration of rotation was 0.1 seconds, after which the wafer was decelerated over a time of 0.03 seconds. After the wafer stopped rotating, it was permitted to remain stopped for 4 seconds. The wafer was then rotated and edge-bead removal and backside rinse steps were performed. Subsequently, the wafer was spun dry at 3000 rpm for 7 seconds. The wafer was then transferred to hot plates at 150° C., 200° C., and 350° C., for solvent bake, re-flow and hardening, respectively. Finally, the wafer was transported back to the wafer cassette.

Example 2

Rapid Spin Step for Spin-On Layers

Two embodiments of the fast spin steps of the invention are graphically represented in FIGS. 3a and 3b. In one embodiment shown in FIG. 3a, the wafer is rotated at about 400 rpm for about 8 sec (phase "1a"). The wafer is then subjected to an increase in spin speed, with a maximum spin speed of about 3000 rpm (phase "2a"). After about 3 sec, the wafer spin speed is slowly reduced to about 500 rpm over about 3 seconds (phase "3a").

FIG. 3b shows another embodiment of the invention, showing rapid acceleration and deceleration, wherein the wafer is rotated at about 200 rpm for about 8 seconds during which time the solution is dispensed onto the rotating wafer (phase "1b"). Thereafter, the wafer is very rapidly accelerated to a maximum speed of 5000 rpm (phase "2b"), and shortly thereafter is rapidly stopped for a period of several seconds (the solution flow-in period or stop time; phase "3b"). During the stop time, the precursor solution has an opportunity to even out in the absence of high accelerative forces. After the rapid spinning step shown in FIG. 3a, or the stop time shown in FIG. 3b, the wafer can be subsequently rotated to carry out other processes known in the art, for example, evaporation of excess solvents, edge trimming and the like. In FIG. 3b, the subsequent rotation speed increases relatively slowly (phase "4b") to a steady rotation rate (phase "5b"). The relatively low rate of increased rotation velocity is selected to prevent the flow of the evened precursor solution back into an uneven configuration prior to solvent evaporation.

Example 3

Relationship Between Deposition Variables and Film Thickness

To determine the effect of varying the time for dispensing, spin time, dispense spin speed, and stop times on film thickness and uniformity, we studied patterned wafers after edge-scan dispensing solutions of HSQ in MIBK, with a concentration of HSQ in the range of about 10% to about 20%, alternatively about 15%.

FIG. 4a shows the range (maximum—minimum) of film thicknesses in Å as a function of dispense time in seconds. Each data point represents measurements of thickness of the HSQ layer on the metal pads, 100 μm per side, across a single wafer. At the short dispense time of 0.9 seconds, the film thickness ranges (defined as the maximum thickness of a film minus the minimum thickness on the same wafer) varied from about 260 Å to about 1150 Å. At high dispense time of 1.5 sec, the range in film thickness varied from about 270 Å to about 1480 Å. In contrast, the dispense time of 1.2 sec. resulted in more even film thicknesses ranging from about 260 Å to about 600 Å. FIG. 4b shows the standard deviation of film thickness in Å as a function of dispense time in seconds. Each data point represents measurements from a single wafer. As with FIG. 4a, the dispense time of 1.2 sec. resulted in the smallest standard deviation of film thicknesses. FIG. 4c shows the wafer non-uniformity of film thickness as a function of the dispense time in seconds. Each data point represents measurements from a single wafer. At a dispense time of 1.2 seconds, the non-uniformity was less, being in the range of about 2.5% to about 5%, compared to the non-uniformities obtained at either lower or higher dispense times. At the dispense spin speed of 200 rpm, the non-uniformity was smaller than that obtained at either slower or higher dispense spin speeds.

FIG. 5a shows the effect of dispense spin speed in rpm on the range (maximum–minimum) of film thickness. Each data point represents measurements from a single wafer. At a spin speed of 200 rpm, the range was smaller than at either 100 rpm or 500 rpm. FIG. 5b shows the standard deviation of the film thickness as a function of dispense spin speed in rpm. As with FIG. 5a, the dispense spin speed of 200 rpm produced the most even film thickness. FIG. 5c shows the non-uniformity of film thickness.

FIGS. 6a, 6b and 6c show film thickness range (maximum–minimum), standard deviation and film non-uniformity, respectively, as a function of spin time in seconds. Each data point represents measurements from a single wafer. At low spin times of from about 0.2 to about 0.6 sec. the range of film thickness was from about 250 Å. to about 650 Å. At longer spin times, the range in film thickness increased to from about 750 Å to about 1450 Å. FIG. 6b shows that with spin times of about 0.5 seconds and below, that the standard deviation of film thickness is minimized. Further, FIG. 6c shows that the wafer non-uniformity is minimized as well at spin times of about 0.5 seconds and less.

FIGS. 7a, 7b and 7c show the range (maximum–minimum), standard deviation and wafer non-uniformity, respectively, of film thicknesses as a function of stop time in seconds. Each data point represents measurements from a single wafer. At a stop time of 4 sec, the non-uniformity was smaller than that obtained at either shorter or longer stop times (FIG. 7a). Furthermore, at stop times up to about 4 seconds, the non-uniformity (FIG. 7c) was smaller than that obtained at longer stop times.

Example 4

Analysis of Film Thickness and Uniformity

Examination of wafers with metal interconnect patterns onto which layers of spin-on materials were deposited using conventional methods and methods of this invention show substantial differences. The methods of this invention improves both the global planarity and the local planarity of the wafers.

A. Global Planarity.

Figure 8A:
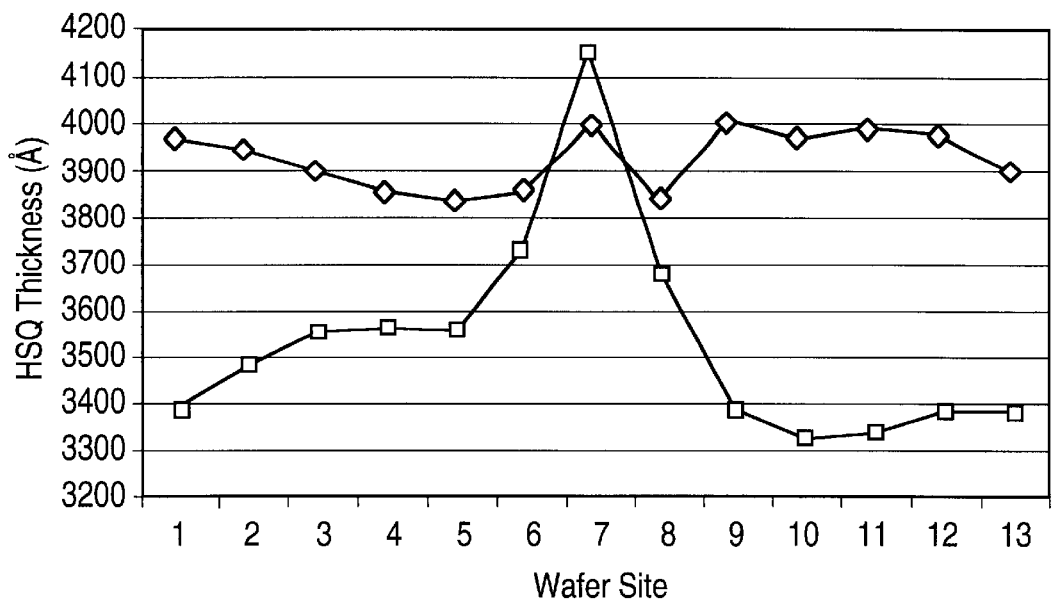
FIG. 8a shows the thickness of a thin film of this invention deposited plotted as a function of the distance from the center of a patterned wafer.

FIG. 8a shows the results of an experiment in which patterned wafers having diameters of 8" (200 mm) were used for the deposition of an HSQ thin films. The patterned wafers had metal pads, each of which was approximately square, with sides of 100 μm in length. We measured the thickness of the HSQ thin film using an Optiprobe m system. The prior art method of center deposition (■) resulted in a film with a pronounced thickening at the center (site 7). The difference in thickness between site 7 and the remainder of the wafer (average of 22.8% non-uniformity) is unacceptably high. In contrast, using the edge-scan dispensing methods of this invention, (♦) resulted in a film with no thickening at the center (site 7). The overall non-uniformity of the thin film was 4.8%, representing an improvement of over 4 times compared to the prior art methods.

Figure 8B:
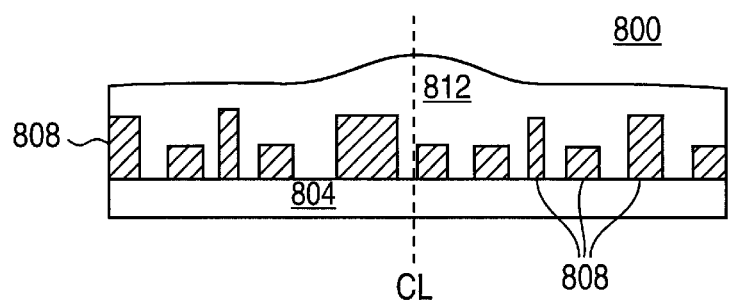
FIG. 8b depicts a spin-on layer deposited using a center-dispense method.
Figure 8C:
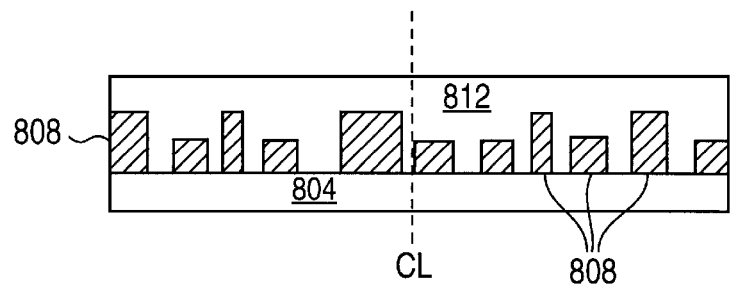
FIG. 8c depicts a spin-on layer deposited using the edge-dispense method of this invention.

FIGS. 8b and 8c depict cross-sectional diagrams of two wafers. First, using prior methods (FIG. 8b), in which the solution was deposited at the center of a patterned wafer, and in which the spin times are long, the spin-on film 800 had a pronounced hump at the center. This reflects a global non-uniformity over the patterned wafer. Substrate 804 had metal lines 808 and a layer of interlayer dielectric material 812. The interlayer dielectric material was dispensed at the centerline (CL) of the wafer and the hump of material remains at the center after spinning, and a thinner aspect of the film being present at the edge of the wafer. This hump can typically be 20% or greater of the total film thickness. In contrast, using the edge dispense method of this invention the spin-on material of wafer 802 is more even (FIG. 8c). There is no hump at the centerline (CL), reflecting improved global planarity.

B. Local Planarity.

Figure 9A:
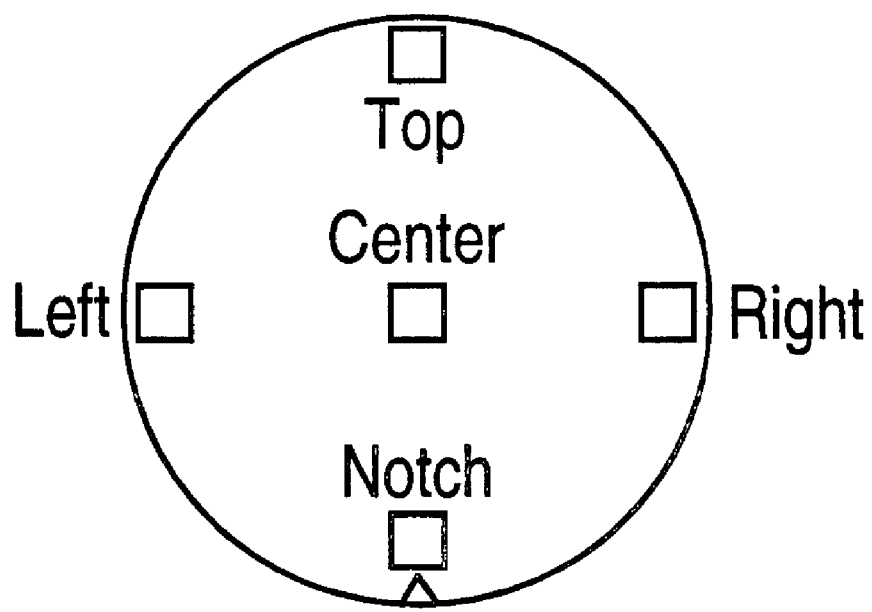
FIG. 9a depicts a semiconductor wafer with four areas selected for measuring the film thickness.

Additionally, semiconductor thin films deposited using conventional spin-on and the spin-on methods of this invention show differences in local planarity. Thin films on patterned wafers were compared visually, using an microscope system. FIG. 9a shows a wafer 900 with a notch at the bottom edge ("notch"). Four metal pads selected for optical analysis were selected at the notch, "top", "left", and "right", as indicated. Each pad was a square pad of metal of about 100 μm on a side.

Figure 9B:
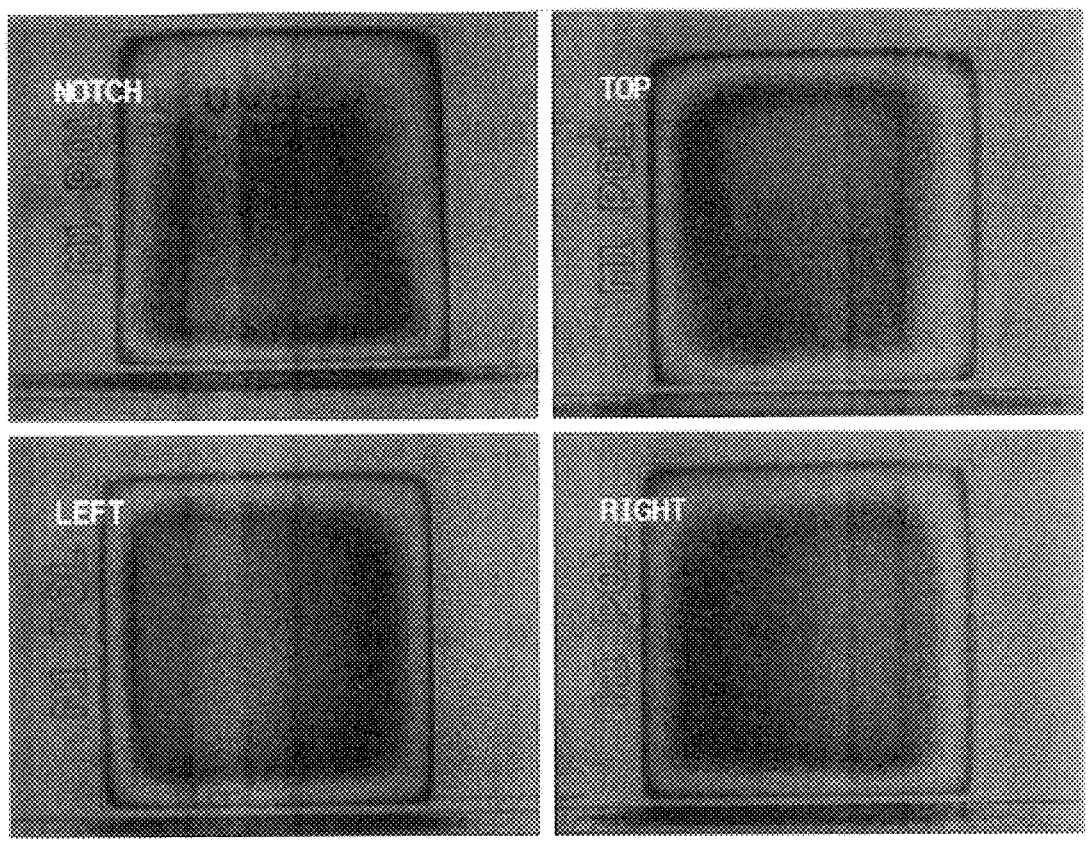
FIGS. 9b and 9c show photographs of the surfaces of wafers containing semiconductor thin films deposited using standard methods (FIG. 9b) and the edge-dispense methods of this invention (FIG. 9c), respectively.

FIG. 9b shows 4 metal pads of a wafer coated using the center dispense standard method in which the precursor is deposited at the center of the wafer, and subsequently distributed by spinning for a relatively long spin time. The standard method produced films with non-uniform coverage, as shown by the darkened areas in the interior aspect of the wafers (FIG. 9b). In FIG. 9a, the "notch" site has an area of thickened film at the bottom, whereas the top of the pad had a thinner film. Similarly, for the "top" pad, the area of thickening was at the top, with an area of thinner film at the bottom of this pad. Moreover, for the "left" pad, the left side had a thicker film, with the right side having a thinner film. Finally for the "right" pad, the right side had the thicker film, with the left side having a thinner film. However, the pad at the center of the wafer did not have such a local non-uniformity. Thus, for each pad located centrifugally from the center of the wafer, the portion of the pad located more centrifugally (toward the edge) had a thicker film, whereas the portion of the pad located more centripitally had a thinner film. This local non-uniformity can become more pronounced for pads located farther from the center of rotation of the wafer.

Figure 9C:
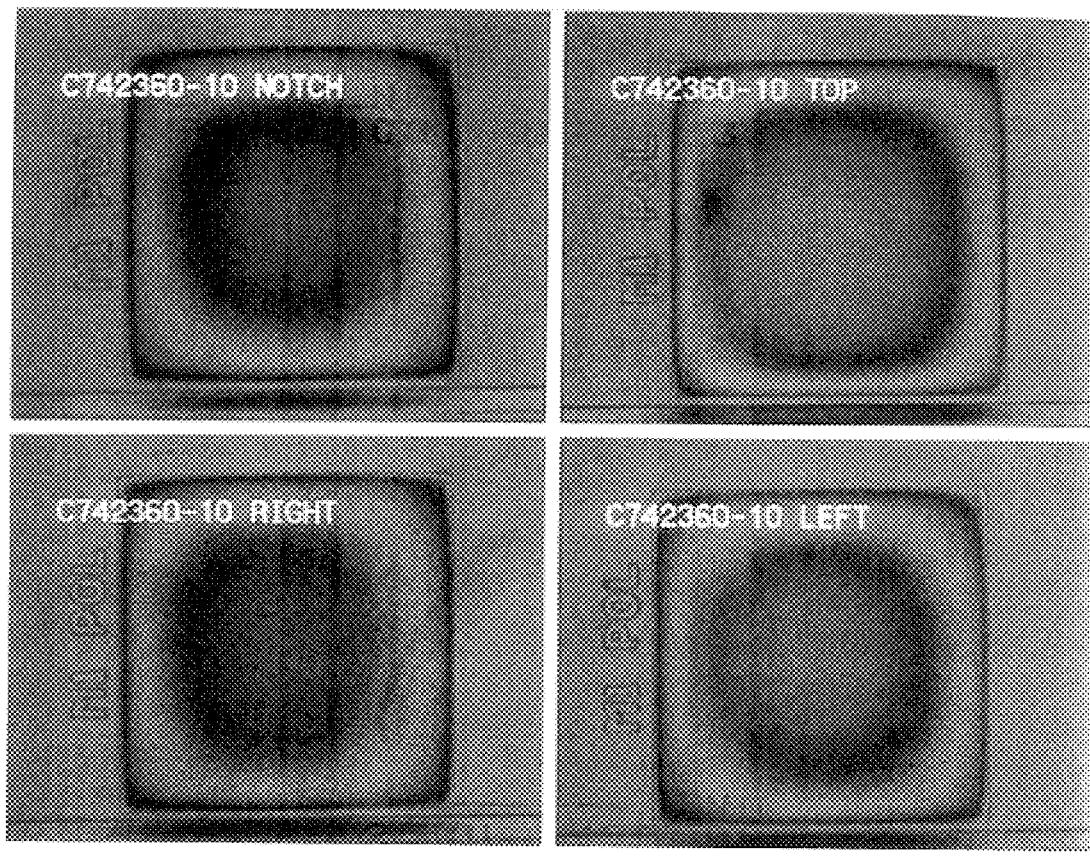

In contrast, the edge-scan dispense method of this invention shown in FIG. 9c produced films with improved local non-uniformity, with a more uniform coverage, as shown by the lack of centrifugal film thickening or centripital film thinning.

Figure 10A:
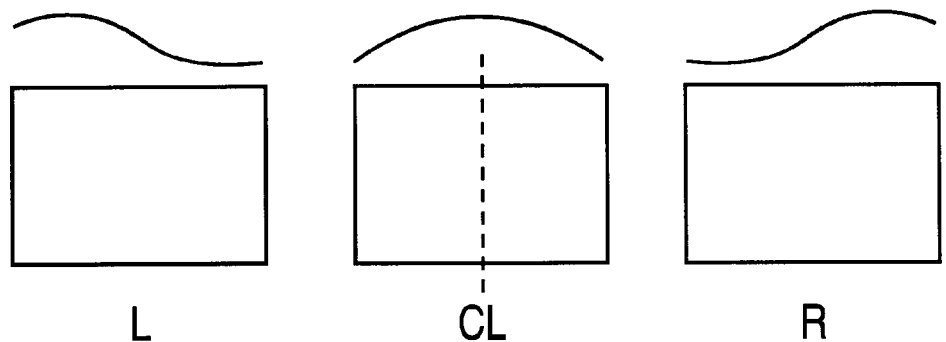
FIG. 10a depicts the local non-uniformity of thin films deposited using conventional spin-on methods.
Figure 10B:
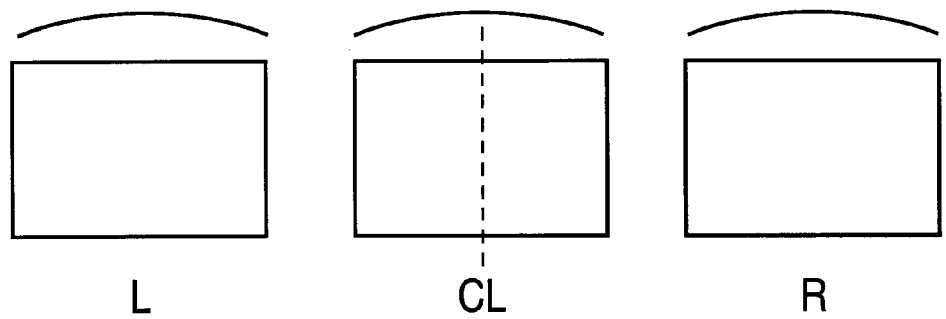
FIG. 10b depicts the local non-uniformity of thin films deposited using the spin-on methods of this invention.

The differences between prior methods and the methods of this invention are also depicted in FIGS. 10a and 10b. FIG. 10a depicts the thin film profile of the center (C), "left" (L) and "right" (R) pads of the edge of the patterned wafer shown in FIG. 9b, wherein the film was deposited using prior art methods. In both cases, there as a pronounced hump at the centrifugal side (toward the edge of the wafer) of the pad and a relatively thinner film at the centripital side of the pad. In contrast, for the methods of the invention FIG. 10b), the profile of the "left" and "right" pads is more uniform, with only a slight thickening at the middle of each pad, has a minimal hump, and the film is thinner in each case.

By way of example only, in an experiment to determine the local non-uniformity of a film of HSQ on a patterned wafer, we measured the range in thickness of a film on a pad, and found the maximum thickness to be 5140 Å, the minimum thickness to be 4825 Å. The difference (range) of 315 Å was substantially less than the typical local non-uniformity obtained using prior art methods.

Example 5

Semiconductor Devices Manufactured Using The Spin-On Methods of this Invention

Figure 11A:
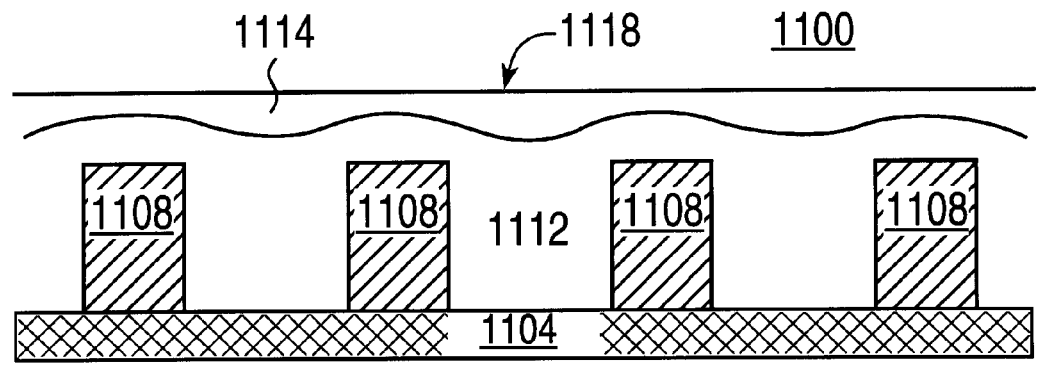
FIGS. 11a and 11b depict single level and multilevel semiconductor devices, respectively, comprising thin films of this invention.
Figure 11B:
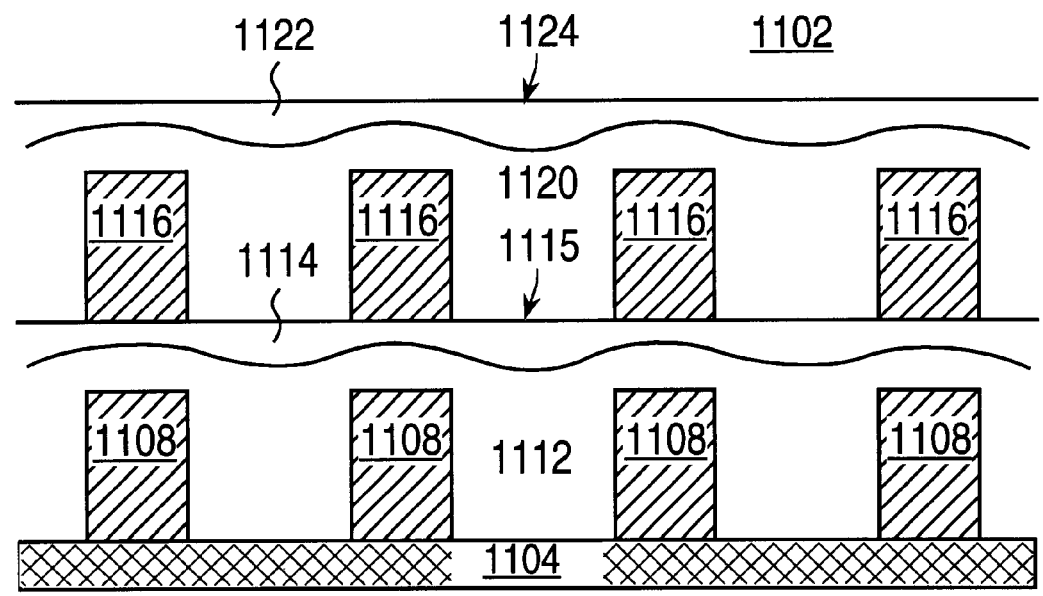

FIGS. 11a and 11b depict semiconductor devices comprising the spin-on films of this invention. FIG. 11a depicts a single level device 1100 comprising a silicon wafer 1104 on which metal lines 1108 are deposited. A spin-on layer of interlevel dielectric (ILD) material 1112 is deposited between and over the tops of the metal lines 1108. This layer has slight local non-uniformity. A layer of CVD deposited material 1114 is deposited on top of the spin-on layer 1112, and the surface 1118 is planarized and polished using chemical mechanical planarization (CMP) methods.

FIG. 11b depicts a multilevel device 1102 manufactured with thin films of this invention. A silicon wafer 1104 has a first set of metal lines 1108 deposited thereon. A first layer of ILD spin-on material 1112 is deposited between and over the tops of the metal lines 1108. Layer 1112 has a slight local non-uniformity. A layer of CVD deposited dielectric material 1114 is deposited on top of the first ILD layer. The surface 1115 of the second layer is planarized using CMP. A second set of metal lines 1116 is deposited on the top of the first CVD layer. A second ILD layer 1120 is deposited between and on the tops of the second set of metal lines 1116. A second layer of CVD dielectric material 1122 is deposited, and the surface 1124 is planarized using CMP. Additional layers can be made in the same way.

While the present invention has been described with reference to its alternative embodiments and aspects, those embodiments and aspects are offered by way of example, not by way of limitation. Those of ordinary skill in the art will be enabled by this disclosure to add to or modify the embodiments of the present invention in various obvious ways. Accordingly, such modifications and additions are deemed to lie within the spirit and scope of the invention as set out in the appended claims.

INDUSTRIAL APPLICABILITY

This invention can be used in the manufacture of thin films using spin-on deposition methods. These methods are especially useful in the manufacture of semiconductor devices, and are specifically useful for the manufacture of semiconductor devices with narrow feature sizes. The improved methods provide for better within-wafer global and local non-uniformity and better planarization, thereby reducing the number of subsequent processing steps necessary to achieve sufficient planarity for the manufacture of semiconductor thin films. The methods permit the manufacture of high-density semiconductor devices with increased manufacturing throughput, decreased cost, and decreased environmental degradation.

What is claimed is:

1. Apparatus for scan dispensing a solution onto a semiconductor wafer mounted on a chuck in a closed deposition chamber, comprising:
   (a) a dispensing system comprising:
      (i) a dispensing arm moveable between the center of said wafer and the edge of said wafer;
      (ii) a dispensing nozzle attached to said dispensing arm, said nozzle disposed over the surface of said wafer;
      (iii) a pump for dispensing said solution; and
   (b) a processor operably connected to said dispensing system and said chuck, said processor being capable of running at least one program for regulating dispensation of solution onto said wafer and for accelerating said wafer containing the dispersed solution at a rate in the range of about $1.6 \times 10^5$ rpm/sec. to about $2.5 \times 10^8$ rpm/sec. to a maximum rotation velocity in said closed deposition chamber.

2. The apparatus of claim 1, wherein the processor is connected to the dispensing arm and the program regulates the movement of said dispensing arm to control the thickness of a layer of solution dispensed onto said semiconductor surface.

3. The apparatus of claim 1, wherein the processor is connected to a pump for adjusting the rate of dispensing said solution and said program regulates the pump to control the thickness of a layer of solution on said semiconductor surface.

4. The apparatus of claim 1, wherein the processor is connected to a motor which rotates said chuck, wherein said program regulates the rate of rotation of said chuck to control the thickness of a layer of solution on said semiconductor surface.

5. The apparatus of claim 1, wherein a memory device stores a program to enable the processor to regulate the rate of dispensing said solution of precursor to control the thickness of a layer of solution on said semiconductor surface.

6. A method for depositing a semiconductor thin film on the surface of a semiconductor substrate, comprising the steps of:
   providing a rotating semiconductor substrate on a wafer having an outer edge, said wafer rotating at a first rotation speed;
   scan dispensing a solution of precursor through a nozzle onto the surface of said semiconductor substrate on said rotating wafer;
   accelerating said rotating wafer at a rate in the range of about $1.6 \times 10^5$ rpm/sec. to about $2.5 \times 10^8$ rpm/sec. to a maximum second rotation speed;
   rotating said wafer at said maximum second rotation speed; and
   permitting the film to dry.

7. The method of claim 6, wherein the step of dispensing covers substantially all of the semiconductor substrate with said solution of precursor.

8. The method of claim 6, wherein the first rotation speed is from about 50 to about 500 rpm.

9. The method of claim 6, wherein the first rotation speed is about 200 revolutions per minute.

10. The method of claim 6, wherein the duration of the step of dispensing is in the range of about 100 $\mu$sec to about 30 sec.

11. The method of claim 6, wherein the step of dispensing comprises using a pump and adjusting the rate of dispensing of the solution of precursor from said pump to regulate the thickness of said solution of precursor.

12. The method of claim 11, wherein the step of dispensing provides a substantially even thickness of said solution of precursor on said semiconductor substrate.

13. The method of claim 6, wherein the step of dispensing begins near said outer edge of said wafer.

14. The method of claim 13, wherein said wafer has an axis of rotation, and the rate of dispensing the solution of precursor is higher at a location away from the axis of rotation than is the rate of dispensing the solution of precursor at a location closer to the axis of rotation.

15. The method of claim 12, wherein the semiconductor wafer has a linear velocity under a dispensing arm, and the ratio of the rate of dispensing said solution of precursor to the linear velocity of the semiconductor wafer under the dispensing arm is substantially constant.

16. The method of claim 6, wherein the rate of dispensing said solution is in the range of greater than about 0.1 ml/min to about 20 ml/min.

17. The method of claim 6, additionally comprising a pump adapted to produce a dispensation pressure in the range of about 0.1 pounds per square inch (psi) to about 20 psi.

18. The method of claim 6, wherein the precursor is hydrogen silsesquioxane.

19. The method of claim 6, wherein the solution of precursor comprises hydrogen silsesquioxane and a solvent.

20. The method of claim 6, wherein said precursor is selected from the group consisting of isopropanol, naphtha and methylisobutylketone.

21. The method of claim 6, wherein the solution of precursor has a concentration, and the concentration of precursor is in the range of about 1% to about 70%.

22. The method of claim 6, wherein the solution of precursor comprises a precursor compound selected from the group consisting of benzylcyclobutene (BCB), perfluorocyclobutene (PFCB), poly(arylene)ethers, fluorinated poly(arylene)ethers, polyimides, fluorinated polyimides, poly(tetrafluoroethylene), polyethylene, and hybridsilsesquioxanes.

* * * * *